(12) United States Patent
Hirono et al.

(10) Patent No.: US 9,006,750 B2
(45) Date of Patent: Apr. 14, 2015

(54) OPTICAL SEMICONDUCTOR PACKAGE, OPTICAL SEMICONDUCTOR MODULE, AND MANUFACTURING METHOD OF THESE

(75) Inventors: Satoshi Hirono, Shiga (JP); Manabu Ikoma, Kyoto (JP); Naoto Inoue, Shiga (JP); Tsuyoshi Miyata, Kyoto (JP); Kazunari Komai, Stuttgart (DE)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 14/004,360

(22) PCT Filed: Mar. 22, 2011

(86) PCT No.: PCT/JP2011/056783
§ 371 (c)(1),
(2), (4) Date: Oct. 23, 2013

(87) PCT Pub. No.: WO2012/124147
PCT Pub. Date: Sep. 20, 2012

(65) Prior Publication Data
US 2014/0042478 A1    Feb. 13, 2014

(30) Foreign Application Priority Data

Mar. 15, 2011   (JP) .................... 2011-056827

(51) Int. Cl.
*H01L 33/54* (2010.01)
*H01L 33/60* (2010.01)
(Continued)

(52) U.S. Cl.
CPC ............... *H01L 33/54* (2013.01); *H01L 33/60* (2013.01); *H01L 2933/005* (2013.01);
(Continued)

(58) Field of Classification Search
CPC ............ H01L 2924/00; H01L 2224/48091; H01L 2924/00014; H01L 2224/48247; H01L 2224/73265; H01L 2224/48465; H01L 2224/32245; H01L 2224/45144; H01L 33/32; H01L 33/58; H01L 2924/3025; H01L 2924/12041
USPC ......... 257/79–100; 438/25, 26, 27–32, 64–65
See application file for complete search history.

(56) References Cited

U.S. PATENT DOCUMENTS

| 6,774,405 B2 * | 8/2004 | Yasukawa et al. ............... 257/99 |
| 2002/0134988 A1 * | 9/2002 | Ishinaga ....................... 257/99 |

(Continued)

FOREIGN PATENT DOCUMENTS

| EP | 2109158 A1 | 10/2009 |
| JP | 6-072263 U | 10/1994 |

(Continued)

OTHER PUBLICATIONS

International Search Report issued in PCT/JP2011/056783 mailed on May 24, 2011 (6 pages).

(Continued)

*Primary Examiner* — Yasser A Abdelaziez
*Assistant Examiner* — Farun Lu
(74) *Attorney, Agent, or Firm* — Osha Liang LLP

(57) ABSTRACT

An optical semiconductor package has a base material that includes a principal surface, an optical semiconductor element that is located on the principal surface of the base material to project or receive light, and an optical transparency sealing layer that seals the optical semiconductor element while covering the principal surface of the base material. An air gap having a shape surrounding an optical axis of the optical semiconductor element is provided in the optical transparency sealing layer such that the light is reflected by an interface of a portion corresponding to an inner circumferential surface of the air gap in an interface formed by the air gap and the optical transparency sealing layer.

11 Claims, 15 Drawing Sheets

(51) Int. Cl.
*H01L 31/0203* (2014.01)
*H01L 31/0232* (2014.01)

(52) U.S. Cl.
CPC .... *H01L 2933/0058* (2013.01); *H01L 31/0203* (2013.01); *H01L 2224/32225* (2013.01); *H01L 2224/48227* (2013.01); *H01L 2224/73265* (2013.01); *H01L 2224/48472* (2013.01); *H01L 31/02325* (2013.01); *H01L 2224/45144* (2013.01); *H01L 2224/48091* (2013.01)

(56) References Cited

U.S. PATENT DOCUMENTS

| | | | |
|---|---|---|---|
| 2009/0251897 A1 | 10/2009 | Kabuki et al. | |
| 2010/0197116 A1* | 8/2010 | Shah et al. | 438/463 |
| 2010/0243870 A1 | 9/2010 | Sakaguchi | |
| 2010/0295079 A1 | 11/2010 | Melman | |

FOREIGN PATENT DOCUMENTS

| | | | |
|---|---|---|---|
| JP | H08-340195 A | | 12/1996 |
| JP | 2000-269551 A | | 9/2000 |
| JP | 2001-177155 A | | 6/2001 |
| JP | 2004-200207 A | | 7/2004 |
| JP | 2006-066657 A | | 3/2006 |
| JP | 2006-278511 A | | 10/2006 |
| JP | 2006-278675 A | | 10/2006 |
| JP | 2007-258776 A | | 10/2007 |
| JP | 2008-098218 A | | 4/2008 |
| JP | 2008-300554 A | | 12/2008 |
| JP | 2009-141317 A | | 6/2009 |
| JP | 2009141317 A | * | 6/2009 |
| JP | 2010-128111 A | | 6/2010 |
| JP | 2010128111 A | * | 6/2010 |
| JP | 2010-232275 A | | 10/2010 |
| JP | 2011-042732 A | | 3/2011 |

OTHER PUBLICATIONS

Extended European Search Report issued in corresponding European Application No. 11860925.4, mailed on Oct. 13, 2014 (11 pages).

Ya Cheng et al.; "Three-Dimensional micro-optical components embedded in photosensitive glass by a femtosecond laser"; Optics Letters; vol. 28, No. 13; Jul. 1, 2003 (3 pages).

* cited by examiner

Fig. 2(A)
Fig. 2(C)
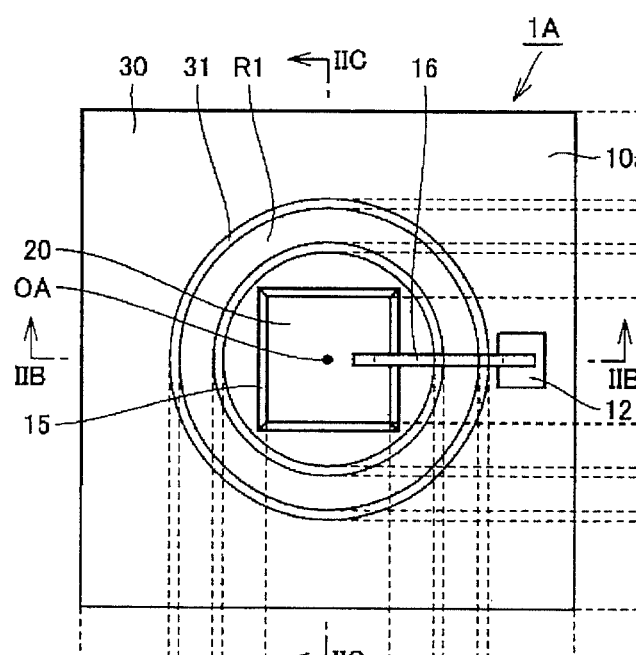
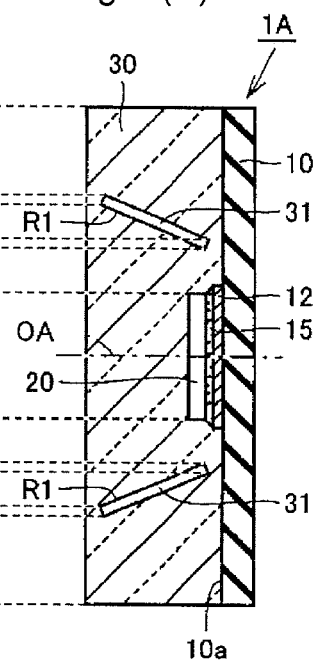
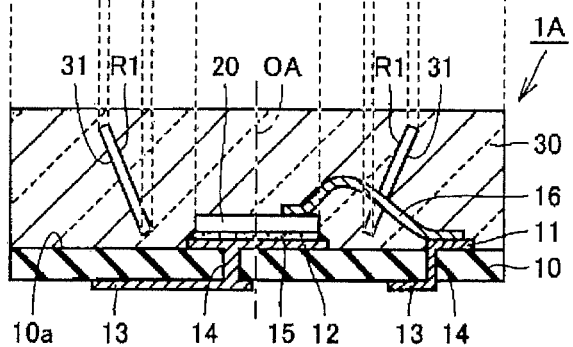
Fig. 2(B)

OPTICAL SEMICONDUCTOR PACKAGE, OPTICAL SEMICONDUCTOR MODULE, AND MANUFACTURING METHOD OF THESE

BACKGROUND

1. Technical Field

The present invention relates to an optical semiconductor package that is packaged by sealing an optical semiconductor element typified by a light emitting element or a light receiving element by an optical transparency sealing layer, an optical semiconductor module provided with the optical semiconductor package, and a manufacturing method thereof.

2. Related Art

Nowadays, a surface mounting device attracts attention because of a demand for downsizing and low profile of an electronic device. Even in a photoelectric sensor including optical semiconductor elements such as a light emitting element typified by an LED (Light Emitting Diode) chip and a light receiving element typified by a PD (Photo Diode) chip, various packaging structures are being studied for the purpose of surface mounting of an optical semiconductor package.

Generally, in the photoelectric sensor, there is also a demand to lengthen a detection distance or detect a finer component in addition to the downsizing and the low profile of the device. In order to meet these demands, it is necessary that light use efficiency be improved such that a sufficient amount of light can be projected or received even if the downsizing and the low profile are achieved in the optical semiconductor package included in the photoelectric sensor.

That is, it is necessary to take off the light emitted from the light emitting element from the optical semiconductor package at high takeoff efficiency in a projector included in the photoelectric sensor, and it is necessary to take in the light incident to the optical semiconductor package to the light receiving element at high take-in efficiency in an optical receiver included in the photoelectric sensor.

Therefore, for example, in the description of Japanese Unexamined Patent Publication No. 2009-141317 (Patent Document 1), a metallic reflector (a reflecting plate) is buried in the optical transparency sealing layer, by which the LED chip or the PD chip is sealed, so as to surround the LED chip or the PD chip, whereby the light is reflected by a surface of the reflector to improve the light takeoff efficiency or the light take-in efficiency.

In the description of Japanese Unexamined Patent Publication No. 2010-232275 (Patent Document 2), a portion of the surface of the optical transparency sealing layer by which the LED chip is sealed extends outward, and the extended portion acts as the reflector, whereby the light is reflected by an interface of the extended portion to improve the light takeoff efficiency.

In the description of Japanese Unexamined Patent Publication No. 2006-278675 (Patent Document 3), a spherical structure having a refractive index different from that of the optical transparency sealing layer is buried in the optical transparency sealing layer by which the LED chip is sealed, whereby the light takeoff efficiency is improved by utilizing refraction and/or diffraction of the light passing through the spherical structure.

Patent Document 1: Japanese Unexamined Patent Publication No. 2009-141317

Patent Document 2: Japanese Unexamined Patent Publication No. 2010-232275

Patent Document 3: Japanese Unexamined Patent Publication No. 2006-278675

SUMMARY

However, as described in Patent Document 1, in the case where the metallic reflector is used, a manufacturing cost is increased because the number of components is increased or a manufacturing process becomes complicated, accuracy of a reflector assembly position with respect to the LED chip or the PD chip is hardly managed with high accuracy. Usually a bonding wire is connected to the surface of LED chip for the purpose of electric connection. In order to prevent a short circuit of the bonding wire, it is necessary that the bonding wire be diverted so as to avoid the reflector, which results in that the low profile of the optical semiconductor package is hardly achieved. Because the bonding wire is hardly formed into a high loop shape, it is necessary that the height of the reflector is set lower. In such cases, an amount of light reflected by the reflector decreases, which results in that the light use efficiency is insufficiently improved.

As described in Patent Document 2, in the case where the portion corresponding to the reflector is formed by extending part of the surface of the optical transparency sealing layer, the light is insufficiently controlled because the portion corresponding to the reflector cannot be disposed close to the LED chip. This results in that the light use efficiency is insufficiently improved. Additionally, it is necessary to process the shape of the optical transparency sealing layer of the portion corresponding to the reflector using a metallic mold and the like, which results in that the accuracy of the assembly position is hardly managed with high accuracy. Furthermore, because of the configuration in which the interface of the portion corresponding to the reflector is exposed to the outside, a desired reflection property is not obtained when a foreign substance adheres to the portion.

As described in Patent Document 3, in the case where the spherical structure having the refractive index different from that of the optical transparency sealing layer is buried in the optical transparency sealing layer, the light is insufficiently controlled because of only the use of the refraction in the surface of the spherical structure. Therefore, the light use efficiency is insufficiently improved and the accuracy of the spherical structure assembly position with respect to the LED chip is hardly managed with high accuracy.

One or more embodiments of the present invention provides a compact, low-profile optical semiconductor package that can easily be manufactured while the light use efficiency can sufficiently be improved, an optical semiconductor module provided with the optical semiconductor package, and a manufacturing method thereof.

In accordance with one aspect of the present invention, an optical semiconductor package includes: a base material that includes a principal surface; an optical semiconductor element that is located on the principal surface of the base material to project or receive light; and an optical transparency sealing layer that seals the optical semiconductor element while covering the principal surface of the base material. Herein, an air gap having a shape surrounding an optical axis of the optical semiconductor element is provided in the optical transparency sealing layer such that the light is reflected by an interface of a portion corresponding to an inner circumferential surface of the air gap in an interface formed by the air gap and the optical transparency sealing layer.

As used herein, the "shape surrounding the optical axis of the optical semiconductor element" includes any shape such as various cylindrical shapes such as a cylindrical shape, a conical plate shape, a square tube shape, and a pyramid plate shape, which completely surround a whole surrounding area of the optical axis of the optical semiconductor element, and substantially cylindrical shapes in which the whole surrounding area of the optical axis of the optical semiconductor element is not completely surrounded but a disconnected portion is provided in part of a circumferential direction as long as the shape has a shape including at least a portion surrounding the optical axis of the optical semiconductor element.

In the optical semiconductor package according to one or more embodiments of the present invention, the air gap is formed by irradiating the optical transparency sealing layer with an ultrashort pulsed laser beam having pulse widths of $10^{-15}$ second to $10^{-11}$ second.

In the optical semiconductor package according to one or more embodiments of the present invention, the air gap surrounds the optical semiconductor element.

In the optical semiconductor package according to one or more embodiments of the present invention, the air gap has a substantially conical plate shape in which a diameter of the air gap increases with distance from the optical semiconductor element along a thickness direction of the optical transparency sealing layer.

In the optical semiconductor package according to one or more embodiments of the present invention, the interface of the portion corresponding to the inner circumferential surface of the air gap includes at least two surfaces having inclinations different from each other with respect to the optical axis of the optical semiconductor element.

In the optical semiconductor package according to one or more embodiments of the present invention, a cylindrical internally added air gap disposed in coaxial with the air gap is further provided inside the air gap and in the optical transparency sealing layer of a portion located on an opposite side to a side on which the base material is located.

In the optical semiconductor package according to one or more embodiments of the present invention, a plurality of cylindrical ring-belt-shape added air gaps, which are disposed in a ring-belt-shape manner in coaxial with the air gap, are further provided inside the air gap and in the optical transparency sealing layer of a portion located on an opposite side to a side on which the base material is located.

In the optical semiconductor package according to one or more embodiments of the present invention, a plurality of cylindrical array-shape added air gaps are further provided inside the air gap and in the optical transparency sealing layer of a portion located on an opposite side to a side on which the base material is located.

In the optical semiconductor package according to one or more embodiments of the present invention, the optical transparency sealing layer includes an optical transparency composition that is of a parent material and an optical transparency filler that is dispersed in the optical transparency composition, and a cylindrical externally added air gap disposed in coaxial with the air gap is further provided in the optical transparency sealing layer of a portion located outside the air gap. In the optical semiconductor package according to one or more embodiments of the present invention, a distance between the interface of the portion corresponding to the inner circumferential surface of the air gap and an interface of a portion corresponding to an inner circumferential surface of the externally added air gap in an interface formed by the externally added air gap and the optical transparency sealing layer is greater than a diameter of the optical transparency filler.

In accordance with another aspect of the present invention, an optical semiconductor module includes: the optical semiconductor package of the present invention; a mounting board on which the optical semiconductor package is mounted; and a casing to which the mounting board is fixed. At this point, the optical semiconductor module includes what is called an optical sensor.

In accordance with still another aspect of the present invention, a method for manufacturing the optical semiconductor package of the present invention, the method includes: a step of mounting the optical semiconductor element on the principal surface of the base material; a step of sealing the optical semiconductor element mounted on the principal surface of the base material by the optical transparency sealing layer; and a step of forming the air gap by irradiating the optical transparency sealing layer with an ultrashort pulsed laser beam having pulse widths of $10^{-15}$ second to $10^{-11}$ second after the sealing of the optical semiconductor element.

In the optical semiconductor package manufacturing method according to one or more embodiments of the present invention, in the air gap forming step, a position of the optical semiconductor element is detected, and a forming position and/or a shape of the air gap is determined based on the detected position of the optical semiconductor element.

In the optical semiconductor package manufacturing method according to one or more embodiments of the present invention, in the air gap forming step, a gradient of a surface of the optical semiconductor element is detected, and a forming position and/or a shape of the air gap is determined based on the detected gradient of the surface of the optical semiconductor element.

In the optical semiconductor package manufacturing method according to one or more embodiments of the present invention, in the air gap forming step, an emission property or a light receiving property of the optical semiconductor element is detected, and a forming position and/or a shape of the air gap is determined based on the detected emission property or light receiving property of the optical semiconductor element.

In accordance with yet another aspect of the present invention of the present invention, a method for manufacturing the optical semiconductor module, the method includes: a step of mounting the optical semiconductor element on the principal surface of the base material; a step of sealing the optical semiconductor element mounted on the principal surface of the base material by the optical transparency sealing layer; a step of mounting the base material on the mounting board; a step of fixing the mounting board to the casing; and a step of forming the air gap by irradiating the optical transparency sealing layer with an ultrashort pulsed laser beam having pulse widths of $10^{-15}$ second to $10^{-11}$ second after the optical semiconductor element is sealed and after the mounting board is fixed to the casing. At this point, the optical semiconductor module includes what is called an optical sensor.

In the optical semiconductor module manufacturing method according to one or more embodiments of the present invention, in the air gap forming step, a position of the optical semiconductor element is detected, and a forming position and/or a shape of the air gap is determined based on the detected position of the optical semiconductor element.

In the optical semiconductor module manufacturing method according to one or more embodiments of the present invention, in the air gap forming step, a gradient of a surface of the optical semiconductor element is detected, and a forming position and/or a shape of the air gap is determined based on the detected gradient of the surface of the optical semiconductor element.

In the optical semiconductor module manufacturing method according to one or more embodiments of the present invention, in the air gap forming step, an emission property or a light receiving property of the optical semiconductor element is detected, and a forming position and/or a shape of the air gap is determined based on the detected emission property or light receiving property of the optical semiconductor element.

Accordingly, the present invention can provide the compact, low-profile optical semiconductor package that can easily be manufactured while the light use efficiency can sufficiently be improved, the optical semiconductor module provided with the optical semiconductor package, and the manufacturing method thereof.

BRIEF DESCRIPTION OF THE DRAWINGS

FIG. 2 is a plan view and a sectional view of the optical semiconductor package in FIG. 1.

DETAILED DESCRIPTION

Figure 1:
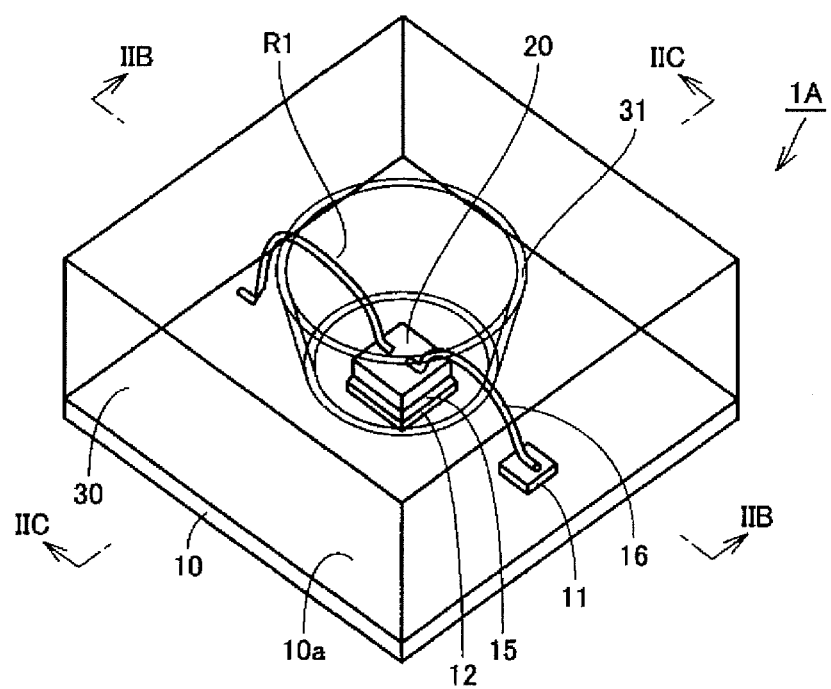
FIG. 1 is a schematic perspective view of an optical semiconductor package according to a first embodiment of the present invention.

Hereinafter, embodiments of the present invention will be described with reference to the drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. Hereinafter, an optical semiconductor package according to a first embodiment will be described, an optical semiconductor according to a second embodiment will be described, a method for manufacturing the optical semiconductor package according to third to fifth embodiments will be described, and a method for manufacturing the optical semiconductor module according to a sixth embodiment will be described. In the second and sixth embodiments, a projector of a photoelectric sensor that is of a type of an optical sensor will be described as a representative example of the optical semiconductor module. In the drawings, the equivalent or common portion is designated by the identical symbol, and overlapping description is neglected.

(First Embodiment)

FIG. 1 is a schematic perspective view of an optical semiconductor package according to a first embodiment of the present invention, and FIG. 2 is a plan view and a sectional view of the optical semiconductor package of the first embodiment. FIG. 2(A) is a plan view of the optical semiconductor package, FIG. 2(B) is a sectional view taken along a line IIB-IIB in FIGS. 1 and 2(A), and FIG. 2(C) is a sectional view taken along a line IIC-IIC in FIGS. 1 and 2(A). A structure of the optical semiconductor package of the first embodiment will be described below with reference to FIGS. 1 and 2.

As illustrated in FIGS. 1 and 2, an optical semiconductor package 1A of the first embodiment has a substantially cuboid external form, and is constructed as an electronic component that can be surface-mounted on a mounting board. For example, the optical semiconductor package 1A of the first embodiment is incorporated in a projector of a photoelectric sensor or an illumination device.

As illustrated in FIGS. 1 and 2, the optical semiconductor package 1A mainly includes an interposer 10 that is of the base material, an LED chip 20 that is of the optical semiconductor element, and an optical transparency sealing layer 30. In a configuration of the optical semiconductor package 1A, the LED chip 20 is directly mounted on the interposer 10 by applying what is called a COB (Chip On Board) technology.

For example, according to one or more embodiments of the present invention, the interposer 10 includes a flat plate-like printed wiring board having a substantially rectangular shape in a planar view, an organic board such as a glass epoxy board. According to one or more embodiments of the present invention, the board having thicknesses of about 0.1 mm to about 0.8 mm can be used as the interposer 10.

Lands 11 and 12 are formed in a principal surface 10a of the interposer 10. The lands 11 and 12 are connection electrodes that are electrically connected to a pair of electrodes (an anode electrode and a cathode electrode) provided in the LED chip 20. A pair of lands 13 is formed in a rear surface of the interposer 10. The pair of lands 13 constitutes the connection electrode when the optical semiconductor package 1A is surface-mounted on the mounting board.

A pair of through-holes 14 is provided in the interposer 10 so as to reach the rear surface from the principal surface 10a. The pair of through-holes 14 are filled with a conductive material, and electrically connects the lands 11 and 12 provided in the principal surface 10a of the interposer 10 and the pair of lands 13 provided in the rear surface of the interposer 10.

The LED chip 20 is a light emitting element that emits light by energization, and provided on the principal surface 10a of the interposer 10. More particularly, the LED chip 20 is located on the land 12 formed on the interposer 10, and coupled to the land 12 by a solder layer 15. The solder layer 15 electrically connects the electrode (for example, the cathode electrode) provided on the rear surface of the LED chip 20 and the land 12.

One end of the bonding wire 16 provided into a loop shape is coupled to the surface of the LED chip 20, and the other end of the bonding wire 16 is coupled to the land 11 provided on the principal surface 10a of the interposer 10. The bonding wire 16 electrically connects the electrode (for example, the anode electrode) provided on the surface of the LED chip 20 and the land 11. According to one or more embodiments of the present invention, a gold wire can be used as the bonding wire 16.

The light emitted from the LED chip 20 spreads radially from the LED chip 20. That is, the light emitted from the LED chip 20 exits from not only the surface side of the LED chip 20 but also from a side surface (a peripheral surface) of the LED chip 20.

The optical transparency sealing layer 30 is formed on the principal surface 10a of the interposer 10. The optical transparency sealing layer 30 seals the LED chip 20, the solder layer 15, the bonding wire 16, and the like therein, and is made of a material that transmits the light emitted from the LED chip 20.

For example, the optical transparency sealing layer 30 is formed by injection or casting and the like with a polymer material as a raw material. According to one or more embodiments of the present invention, an epoxy resin, a silicone resin, polymethacrylate, polycarbonate, cycloolefin polymer, and the like can be used as the polymer material.

An air gap 31 is provided in the optical transparency sealing layer 30. According to one or more embodiments of the present invention, the air gap 31 has a cylindrical shape surrounding an optical axis OA of the LED chip 20, also surrounding the LED chip 20. For example, the air gap 31 is formed by irradiating the optical transparency sealing layer 30 with an ultrashort pulsed laser beam (hereinafter also referred to as a femtosecond laser beam for the sake of convenience) having pulse widths of $10^{-15}$ second (1 femtosecond) to $10^{-11}$ second (10 picoseconds).

In the laser processing in which the femtosecond laser beam is used, an inside of a polymer structure is irradiated with the femtosecond laser beam to induce a change in refractive index, hole making, and blackening in the portion irradiated with the femtosecond laser beam. In the first embodiment, the air gap 31 is formed in the optical transparency sealing layer 30 by utilizing the hole making. The specific processing method is described in detail later in third to sixth embodiments.

According to one or more embodiments of the present invention, as illustrated in the drawings, the air gap 31 is formed into a substantially conical plate shape in which a diameter increases with distance from the LED chip 20 along a thickness direction of the optical transparency sealing layer 30. For example, the position irradiated with the femtosecond laser beam may be scanned along the substantially conical plate shape in order to form the air gap 31 having the shape.

Figure 3:
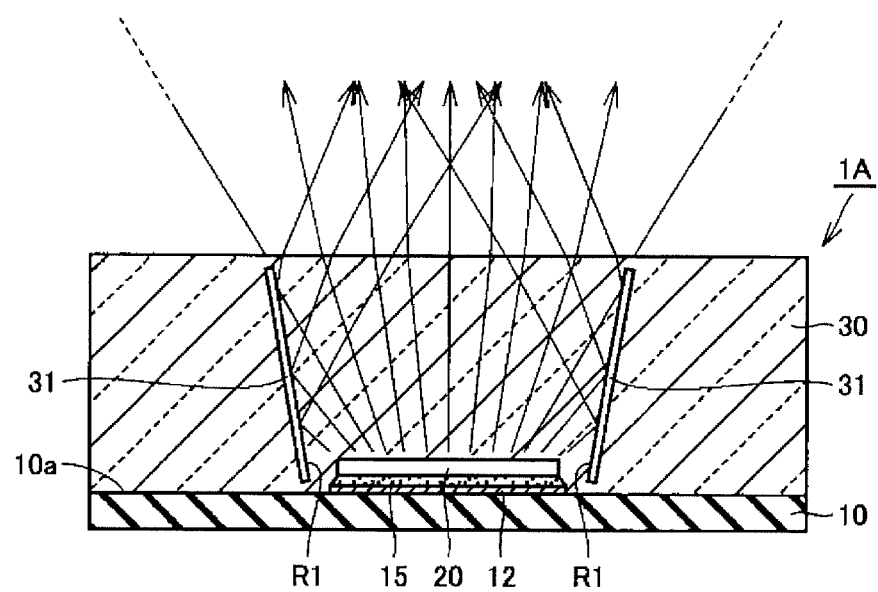
FIG. 3 is a schematic sectional view illustrating an optical path in the optical semiconductor package in FIG. 1.

FIG. 3 is a schematic sectional view illustrating an optical path in the optical semiconductor package of the first embodiment. The optical path in the optical semiconductor package of the first embodiment will be described below with reference to FIG. 3.

As illustrated in FIG. 3, in the optical semiconductor package 1A of the first embodiment, the light emitted from the LED chip 20 is transmitted through the optical transparency sealing layer 30 and projected outward from the surface of the optical transparency sealing layer 30.

At this point, the light emitted from the LED chip 20 with at least a predetermined angle with respect to the optical axis OA is projected toward a irradiation target region. Unless the air gap 31 is not provided in the optical transparency sealing layer 30, the light emitted from the LED chip 20 with an angle greater than the predetermined angle is projected out of the irradiation target region. The light projected out of the irradiation target region becomes useless light, which degrades the light takeoff efficiency.

However, in the optical semiconductor package 1A of the first embodiment, the light emitted from the LED chip 20 with the angle greater than the predetermined angle is also reflected by an interface R1 of a portion that is corresponding to an inner circumferential surface of the air gap 31 in an interface formed between the cylindrical air gap 31 and the optical transparency sealing layer 30, and the reflected light has the angle equal to or less than the predetermined angle with respect to the optical axis OA and is projected toward the irradiation target region. Accordingly, the interface R1 acts as a reflecting surface (a reflector) that reflects part of the light emitted from the LED chip 20, so that the light collecting capacity is enhanced, and the light takeoff efficiency is thus drastically improved.

As described above, when the LED chip 20 is surrounded by the cylindrical air gap 31 (that is, when an end portion in an axial direction of the cylindrical air gap 31 extends to the position opposed to the side surface (the peripheral surface) of the LED chip 20), because the light laterally emitted from the LED chip 20 can be reflected by the interface R1, a quantity of the light emitted from the optical semiconductor package 1A toward the irradiation target region can be increased. Accordingly, from this point of view, the light collecting capacity is enhanced to improve the light takeoff efficiency.

In the optical semiconductor package 1A of the first embodiment, as described above, because the light emitted from the LED chip 20 is partially reflected to change the path, a degree of freedom of light path control increases compared with the case that the path is changed using diffraction or refraction. Accordingly, a degree of freedom of design increases largely, and the optical semiconductor package optimized according to specifications can easily be manufactured.

In the optical semiconductor package 1A of the first embodiment, the interface R1 that acts as the reflector is formed while buried in the optical transparency sealing layer 30, so that the interface R1 can be disposed close to the LED chip 20. Therefore, the improvement of the takeoff efficiency can be implemented, and the low profile and the downsizing of the optical semiconductor package 1A can also be implemented more significantly than ever before. Additionally, the interface R1 is not exposed to the outside because the air gap 31 is buried in the optical transparency sealing layer 30.

Therefore, adhesion of a foreign substance can be prevented, and a desired reflection property can be obtained with good reproducibility.

In the optical semiconductor package 1A of the first embodiment, the air gap 31 is formed by the laser processing in which the femtosecond laser beam is used, so that generation of a breakage such as disconnection in the bonding wire 16 can be prevented by properly setting a processing condition of the laser processing. Accordingly, it is not necessary that the bonding wire 16 be diverted so as not to intersect the interface R1, and it is not necessary that the bonding wire 16 be formed into a high loop shape so as not to intersect the interface R1, but the bonding wire 16 having an ordinary height is formed into the loop shape. As a result, the height of the interface R1 can freely be set without being subject to a restriction of the bonding wire 16, and the improvement of the light use efficiency and the low profile of the optical semiconductor package 1A can simultaneously be implemented.

In the optical semiconductor package 1A of the first embodiment, it is not necessary that the reflector be constructed using another component such that a metallic reflector is used. Therefore, the number of components or assembly man-hour is decreased, and the optical semiconductor package can easily be manufactured at low cost. Additionally, the air gap 31 is formed by the laser processing in which the femtosecond laser beam is used, so that the formation position or the shape of the interface R1 can be optimized in consideration of an assembly state of the LED chip 20 or a variation of an element property while the interface R1 is accurately positioned with respect to the LED chip 20 with high accuracy. Therefore, not only the manufacturing can be facilitated but also the improvement of performance can be implemented. The facilitation of the manufacturing and the improvement of the performance will be described in detail later in the third to sixth embodiments.

The optical semiconductor package 1A of the first embodiment can easily be manufactured, the downsizing and the low profile of the optical semiconductor package can be implemented, and the light use efficiency can sufficiently be improved. When the optical semiconductor package 1A is applied to the projector of the photoelectric sensor, a detection distance can be lengthened, and the finer component can be detected. Therefore, the performance can be improved. When the optical semiconductor package 1A is applied to the illumination device, the brightness of the illumination device can be enhanced in a front view.

The case that the optical semiconductor package 1A of the first embodiment is applied to the projector of the photoelectric sensor will be described in detail. As described above, because the spread of the light emitted to the irradiation target region can be reduced while the light use efficiency is improved, a numerical aperture of a lens disposed in the irradiation target region can be decreased. Accordingly, the detection distance can easily be lengthened, and coupling efficiency of an optical fiber is also improved in the case where the optical semiconductor package 1A is applied to what is called a fiber photoelectric sensor in which the light is introduced to the optical fiber from the projector.

EXAMPLE

Figure 4:
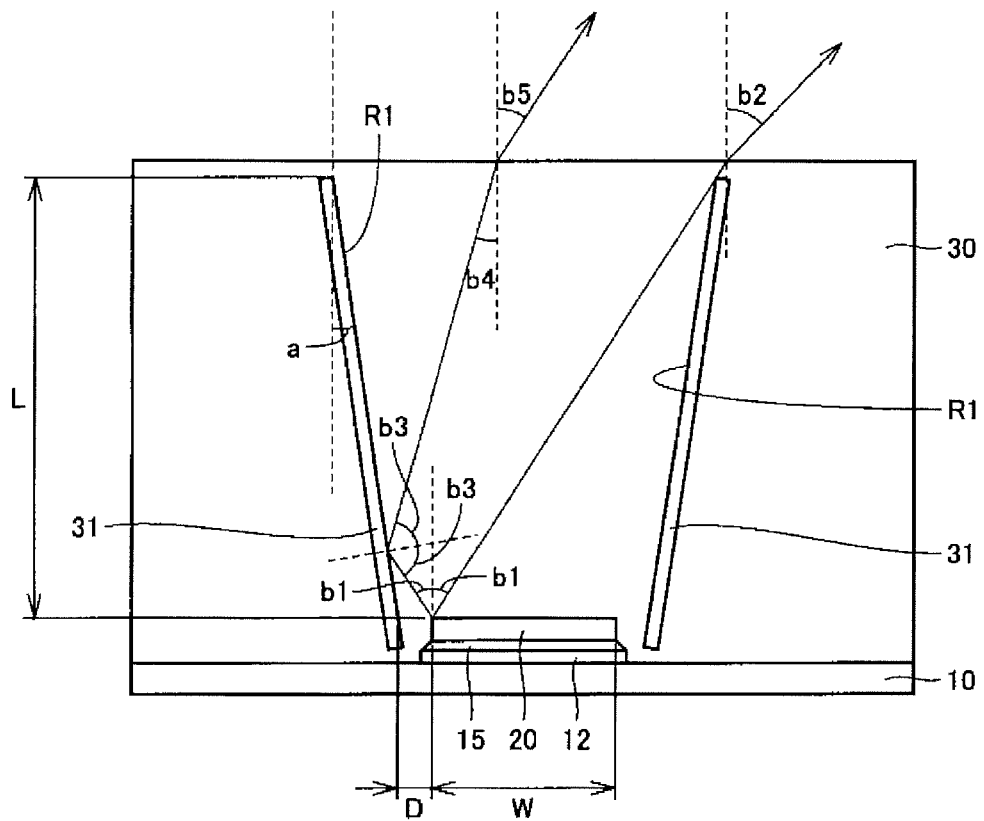
FIG. 4 is a schematic diagram of an optical semiconductor package according to an example.

FIG. 4 is a schematic diagram of an optical semiconductor package according to an example of the first embodiment. The example that is of a specific design case will be described below with reference to FIG. 4.

In the example illustrated in FIG. 4 is designed such that the LED chip in which an emission property in air is a total angle of 120° (a half angle of 60°) and an emission surface is a 0.3 mm square (that is, a length of one side is W=0.3 mm) is used as the LED chip 20, such that a polymer material having a refractive index of 1.5 is used as the optical transparency sealing layer 30, and such that the emission property of the light emitted from the surface of the optical transparency sealing layer 30 becomes the total angle of 60° (the half angle of 30°). In the case where the LED chip 20 is sealed in the optical transparency sealing layer 30 having the refractive index of 1.5, the emission property of the LED chip 20 becomes the total angle of 70.5° (the half angle of 35.3°).

At this point, it is assumed that an inclination a of the interface R1 formed by providing the air gap 31 in the optical transparency sealing layer 30 with respect to the optical axis OA of the LED chip 20 is set to 8°, that a length in the axial direction along the optical axis OA of the interface R1 (in this case, a length L of the interface R1 from the position at the same level as the surface of the LED chip 20 to a portion reaching a neighborhood of the surface of the optical transparency sealing layer 30) is set to 1.7 mm, and that a distance between the interface R1 and the LED chip 20 (in this case, a distance D between the interface R1 at the same level as the LED chip 20 and the end portion of the surface of the LED chip 20) is set to 0.06 mm.

In this case, in the light emitted from the surface of the LED chip 20, for the light in which an exit angle b1 is less than or equal to 19.5° with respect to the optical axis OA, an exit angle b2 becomes 30° or less in the surface of the optical transparency sealing layer 30. Accordingly, the light in which an exit angle b1 is less than or equal to 19.5° with respect to the optical axis OA is exited as the light satisfying the condition from the surface of the optical transparency sealing layer 30 without the reflection at the interface R1.

On the other hand, in the light emitted from the surface of the LED chip 20, the light in which the exit angle b1 is grater than 19.5° and less than or equal to the half angle of 35.3° with respect to the optical axis OA is incident to the interface R1 with an incident angle b3 greater than 62.7°. At this point, because the incident angle b3 is greater than or equal to a critical angle, a total reflection condition is satisfied, the light that is incident to the interface R1 with the incident angle b3 greater than 62.7° is not transmitted through the interface R1 but wholly reflected.

The light that is reflected by the interface R1 with the reflection angle b3 greater than 621° is incident to the surface of the optical transparency sealing layer 30 with an incident angle b4 less than 19.3° with respect to the surface of the optical transparency sealing layer 30, and an exit angle b5 of the incident light is less than or equal to 29.7° in the surface of the optical transparency sealing layer 30.

In the optical semiconductor package of the example, the air gap 31 is provided such that the interface R1 having the above configuration is formed in the optical transparency sealing layer 30. Therefore, the light emitted from the LED chip 20 with the exit angle less than or equal to 60° in the air (that is, the light within the total angle component of the LED chip 20) is fully converted so as to wholly exit from the surface of the optical transparency sealing layer 30 as the light in which the exit angle is less than or equal to 30° (that is, the light of the total angle less than or equal to 60°). Thus, the light use efficiency can largely be improved, because the light collecting capacity can drastically be enhanced by properly adjusting the shape, the size, and disposed position of the interface R1.

<First Modification>

Figure 5:
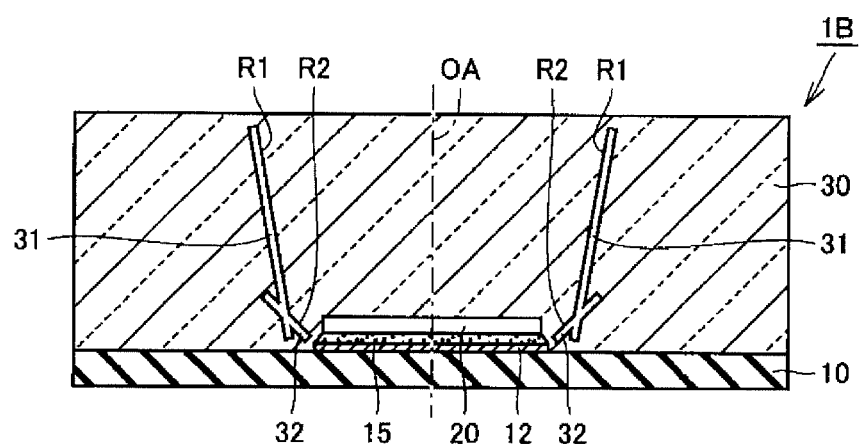
FIG. 5 is a schematic sectional view of an optical semiconductor package according to a first modification.

FIG. 5 is a schematic sectional view of an optical semiconductor package according to a first modification of the first embodiment. The optical semiconductor package of the first modification will be described below with reference to FIG. 5.

As illustrated in FIG. 5, in an optical semiconductor package 1B of the first modification, an air gap 32 different from the air gap 31 is provided in the optical transparency sealing layer 30 in addition to the air gap 31. The air gap 32 has the cylindrical shape surrounding the optical axis OA of the LED chip 20, and surrounds the LED chip 20. Similarly to the air gap 31, for example, the air gap 32 is also formed by irradiating the optical transparency sealing layer 30 with the femtosecond laser beam, and the air gap 32 is formed into the substantially conical plate shape as illustrated in FIG. 5.

The air gap 32 is provided close to the end portion on the side of the LED chip 20 of the air gap 31 so as to intersect the air gap 31, and the air gap 32 is obliquely formed with the air gap 31 greater than the angle formed by the air gap 31 and the optical axis OA of the LED chip 20. At this point, an interface R2 corresponding to the inner circumferential surface of the air gap 32 in the interface formed by the cylindrical air gap 32 and the optical transparency sealing layer 30 acts as the reflecting surface (the reflector) that reflects the light laterally emitted from the LED chip 20 (particularly, the light emitted from the side surface (the peripheral surface) of the LED chip 20).

As described above, in the optical semiconductor package 1B of the first modification, the interface corresponding to the inner circumferential surfaces of the air gaps 31 and 32 is constructed by the two continuous interfaces R1 and R2 having the different inclinations with respect to the optical axis OA of the LED chip 20, and the inclination of the interface R2 is greater than the inclination of the interface R1. Therefore, the light laterally emitted from the LED chip 20 can be guided to the surface of the optical transparency sealing layer 30 by being reflected by the interface R2.

According to the optical semiconductor package 1B of the first modification, compared with the optical semiconductor package 1A of the first embodiment, the quantity of the light exiting toward the irradiation target region can further be increased, and the light takeoff efficiency is improved. According to one or more embodiments of the present invention, the inclination of the interface R2 is set to about 45° with respect to the optical axis OA.

<Second Modification>

Figures 6A, 6B:
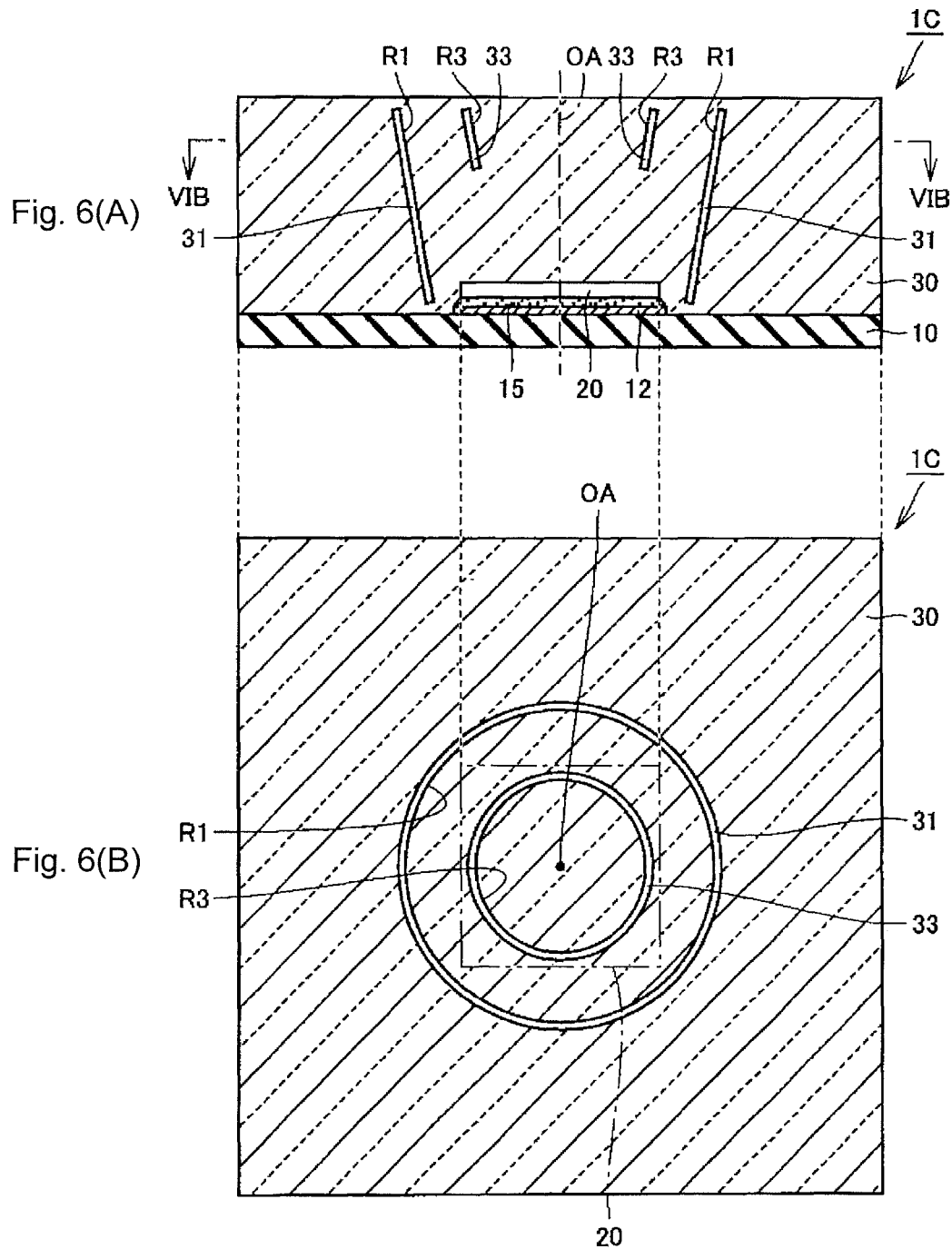
FIG. 6 is a schematic sectional view of an optical semiconductor package according to a second modification.

FIG. 6 is a schematic sectional view of an optical semiconductor package according to a second modification of the first embodiment. FIG. 6(A) is a sectional view in the case where the optical semiconductor package is cut along a plane including the optical axis of the LED chip, and FIG. 6(B) is a sectional view of the optical semiconductor package taken along a line VIB-VIB in FIG. 6(A). The optical semiconductor package of the second modification will be described below with reference to FIG. 6.

As illustrated in FIG. 6, in an optical semiconductor package 1C of the second modification, an internally added air gap 33 is provided in the optical transparency sealing layer 30 in addition to the air gap 31. The internally added air gap 33 has a cylindrical shape surrounding the optical axis OA of the LED chip 20. Similarly to the air gap 31, for example, the internally added air gap 33 is formed by irradiating the optical transparency sealing layer 30 with the femtosecond laser beam, and the internally added air gap 33 is formed into the substantially conical plate shape as illustrated in FIG. 6.

The internally added air gap 33 is provided inside the air gap 31 and in the portion on the opposite side to the side on which the interposer 10 is located in the optical transparency sealing layer 30 (that is, the portion closer to the surface of the optical transparency sealing layer 30), and the internally added air gap 33 is disposed in coaxial with the air gap 31. At this point, an interface R3 corresponding to the inner circumferential surface of the internally added air gap 33 in the interface formed by the cylindrical internally added air gap 33 and the optical transparency sealing layer 30 acts as the reflecting surface (the reflector) that reflects part of the light emitted from the LED chip 20.

Compared with the optical semiconductor package 1A of the first embodiment, the optical semiconductor package 1C of the second modification is suitable to the case where particularly the thickness of the optical transparency sealing layer 30 is further decreased. In the optical semiconductor package 1A of the first embodiment, when the optical transparency sealing layer 30 is made thinner, the length of the interface R1 that acts as the reflector cannot sufficiently be ensured in the extending direction of the optical axis OA of the LED chip 20. Particularly, the light, which exits from the portion closer to the end portion of the surface of the LED chip 20 toward the direction farther away from the interface R1 with the angle greater than the predetermined angle, reaches the surface of the optical transparency sealing layer 30 without being reflected by any portion of the interface R1, and projected toward the outside of the irradiation target region. On the other hand, when the configuration of the optical semiconductor package 1C of the second modification is used, the interface R3 that acts as the reflector is provided inside the interface R1 that acts as the reflector, and the light can be reflected by the interface R3 and projected toward the irradiation target region.

According to the optical semiconductor package 1C of the second modification, compared with the optical semiconductor package 1A of the first embodiment, the low profile and the downsizing are further achieved without degrading the light collecting capacity. In the optical semiconductor package 1C of the second modification, by way of example, the internally added air gap 33 is provided in the portion closer to the surface of the optical transparency sealing layer 30. Alternatively, the internally added air gap 33 may be provided in the portion closer to the interposer 10 of the optical transparency sealing layer 30 or the neighborhood of the substantially central portion of the optical transparency sealing layer 30 along the direction of the optical axis OA.

<Third Modification>

Figures 7A, 7B:
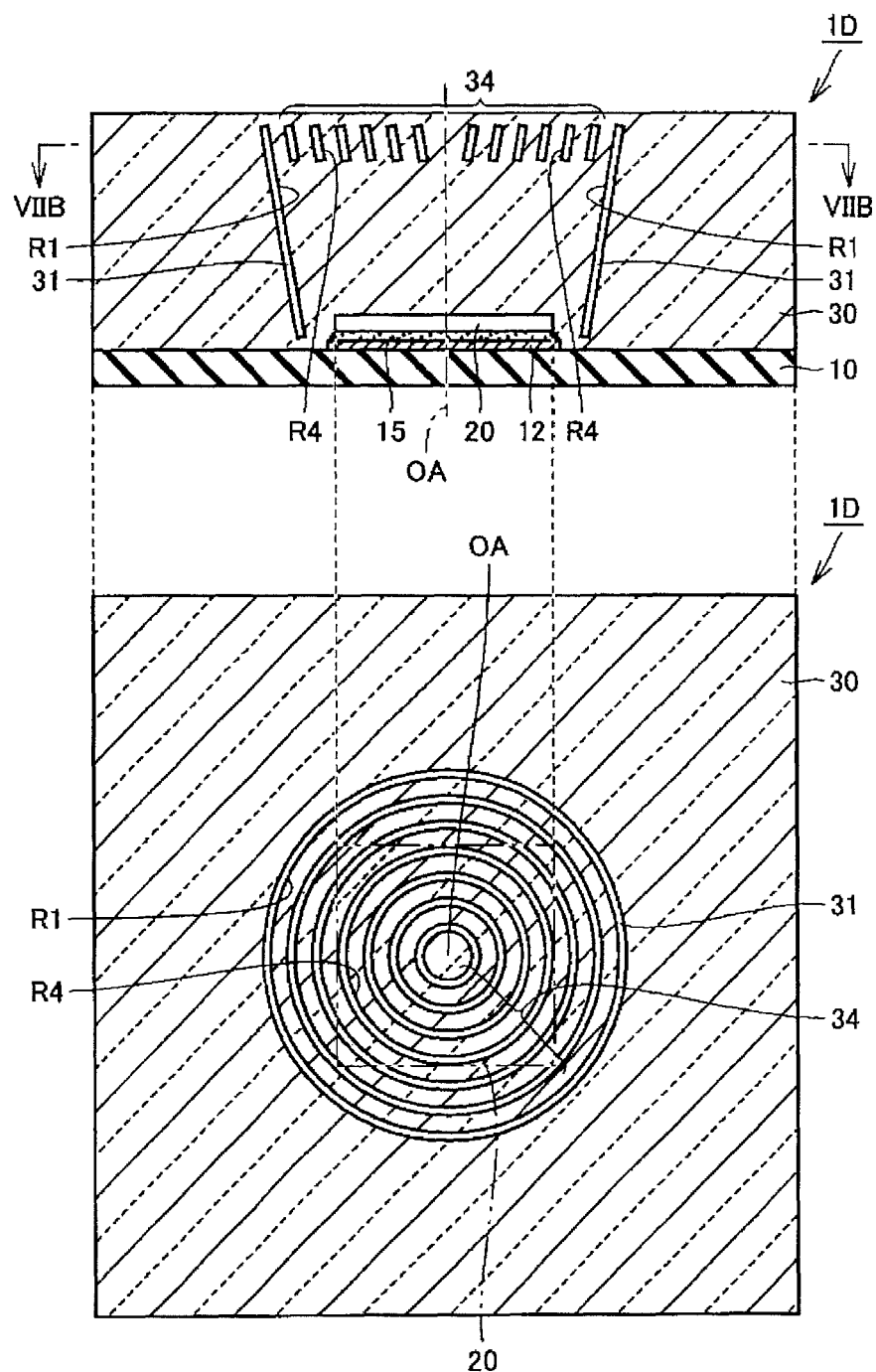
FIG. 7 is a schematic sectional view of an optical semiconductor package according to a third modification.

FIG. 7 is a schematic sectional view of an optical semiconductor package according to a third modification of the first embodiment. FIG. 7(A) is a sectional view in the case where the optical semiconductor package is cut along the plane including the optical axis of the LED chip, and FIG. 7(B) is a sectional view of the optical semiconductor package taken along a line VIIB-VIIB in FIG. 7(A). The optical semiconductor package of the third modification will be described below with reference to FIG. 7.

As illustrated in FIG. 7, in an optical semiconductor package 1D of the third modification, a ring-belt-shape added air gap 34 is provided in the optical transparency sealing layer 30 in addition to the air gap 31. Each air gap included in the ring-belt-shape added air gap 34 has the cylindrical shape surrounding the optical axis OA of the LED chip 20. Similarly to the air gap 31, for example, the ring-belt-shape added air gap 34 is formed by irradiating the optical transparency sealing layer 30 with the femtosecond laser beam, and each air gap is formed into the substantially conical plate shape as illustrated in FIG. 7.

The ring-belt-shape added air gap 34 is provided inside the air gap 31 and in the portion on the opposite side to the side on which the interposer 10 is located in the optical transparency sealing layer 30 (that is, the portion closer to the surface of the optical transparency sealing layer 30), and the ring-belt-shape added air gap 34 is disposed in coaxial with the air gap 31. At this point, an interface R4 formed by the ring-belt-shape added air gap 34 and the optical transparency sealing layer 30 acts as the reflecting surface (the reflector) that reflects part of the light emitted from the LED chip 20.

In the optical semiconductor package 1D of the third modification, a large quantity of light is incident to the plurality of interfaces R4 by providing the ring-belt-shape added air gap 34, and the light is multiply-reflected by the interface R4 to reach the surface of the optical transparency sealing layer 30. Even if the interface R4 is provided so as not to necessarily satisfy the total reflection condition, the large quantity of light can be projected toward the irradiation target region.

According to the optical semiconductor package 1D of the third modification, compared with the optical semiconductor package 1A of the first embodiment, the low profile and the downsizing are further achieved. In the optical semiconductor package 1D of the third modification, by way of example, the ring-belt-shape added air gap 34 is provided in the portion closer to the surface of the optical transparency sealing layer 30. Alternatively, the ring-belt-shape added air gap 34 may be provided in the portion closer to the interposer 10 of the optical transparency sealing layer 30 or the neighborhood of the substantially central portion of the optical transparency sealing layer 30 along the direction of the optical axis OA.

<Fourth Modification>

Figures 8A, 8B:
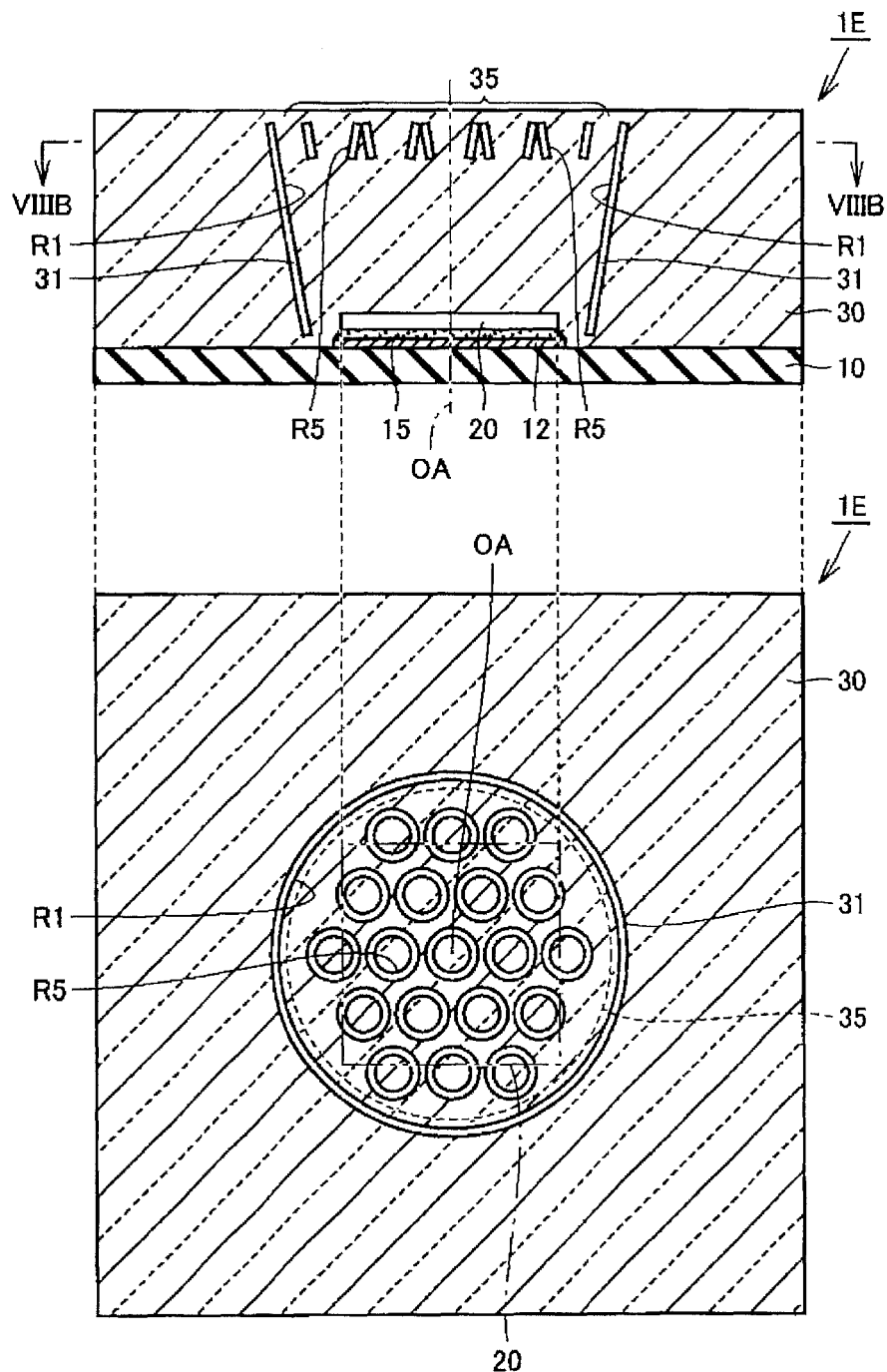
FIG. 8 is a schematic sectional view of an optical semiconductor package according to a fourth modification.

FIG. 8 is a schematic sectional view of an optical semiconductor package according to a fourth modification of the first embodiment. FIG. 8(A) is a sectional view in the case where the optical semiconductor package is cut along the plane including the optical axis of the LED chip, and FIG. 8(B) is a sectional view of the optical semiconductor package taken along a line VIIIB-VIIIB in FIG. 8(A). The optical semiconductor package of the fourth modification will be described below with reference to FIG. 8.

As illustrated in FIG. 8, in an optical semiconductor package 1E of the fourth modification, an array-shape added air gap 35 is provided in the optical transparency sealing layer 30 in addition to the air gap 31. Each air gap included in the array-shape added air gap 35 has the cylindrical shape. Similarly to the air gap 31, for example, the array-shape added air gap 35 is formed by irradiating the optical transparency sealing layer 30 with the femtosecond laser beam, and each air gap is formed into the substantially conical plate shape as illustrated in FIG. 8.

The array-shape added air gap 35 is provided inside the air gap 31 and in the portion on the opposite side to the side on which the interposer 10 is located in the optical transparency sealing layer 30 (that is, the portion closer to the surface of the optical transparency sealing layer 30). At this point, an interface R5 formed by the array-shape added air gap 35 and the optical transparency sealing layer 30 acts as the reflecting surface (the reflector) that reflects part of the light emitted from the LED chip 20.

In the optical semiconductor package 1E of the fourth modification, the large quantity of light is incident to the plurality of interfaces R5 by providing the array-shape added air gap 35, and the light is reflected by the interface R5 to reach the surface of the optical transparency sealing layer 30. Therefore, the large quantity of light can be projected toward the irradiation target region.

According to the optical semiconductor package 1E of the fourth modification, compared with the optical semiconductor package 1A of the first embodiment, the low profile and the downsizing are further achieved. Particularly, when the optical semiconductor package 1E of the fourth modification is incorporated in a projector of a fiber photoelectric sensor that projects the light to a multi-core optical fiber, and when each of the array-shape added air gaps 35 is disposed while corresponding to a core of the multi-core optical fiber, the coupling efficiency is drastically improved in the optical fiber. In the optical semiconductor package 1E of the fourth modification, by way of example, the array-shape added air gap 35 is provided in the portion closer to the surface of the optical transparency sealing layer 30. Alternatively, the array-shape added air gap 35 may be provided in the portion closer to the interposer 10 of the optical transparency sealing layer 30 or the neighborhood of the substantially central portion of the optical transparency sealing layer 30 along the direction of the optical axis OA.

<Fifth Modification>

Figure 9:
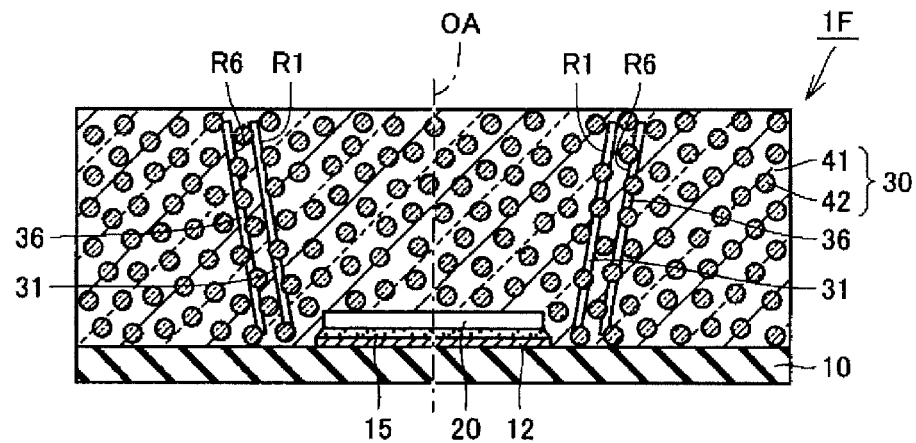
FIG. 9 is a schematic sectional view of an optical semiconductor package according to a fifth modification.
Figure 10:
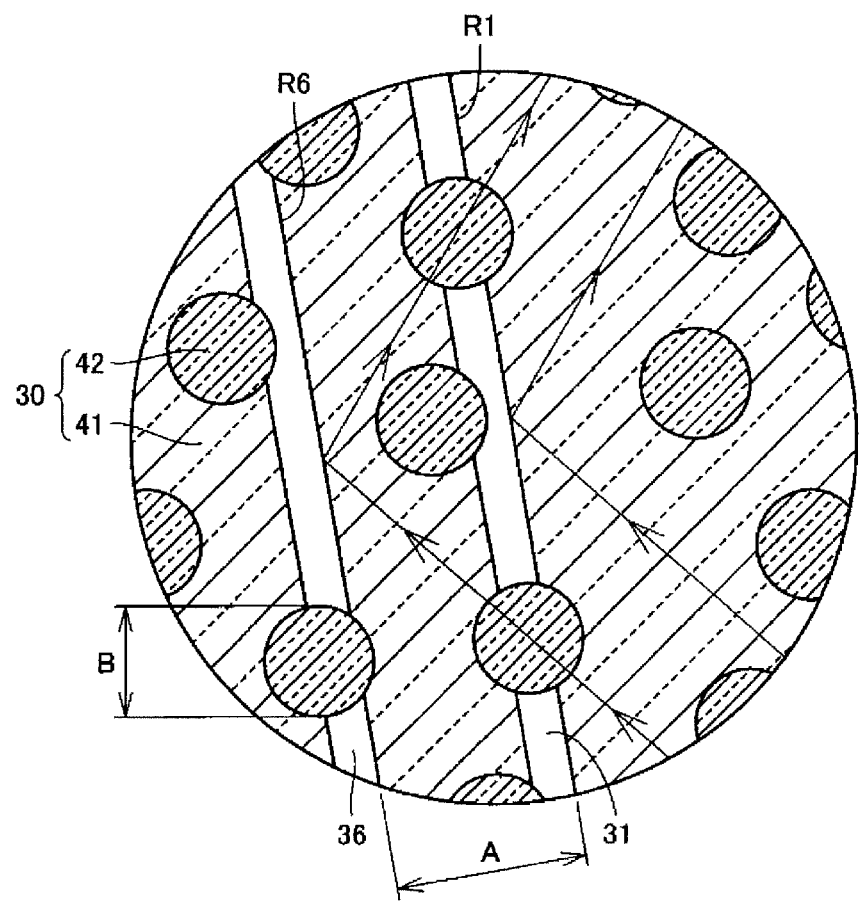
FIG. 10 is an enlarged schematic sectional view of a main part of the optical semiconductor package in FIG. 9.

FIG. 9 is a schematic sectional view of an optical semiconductor package according to a fifth modification, and FIG. 10 is an enlarged schematic sectional view of a main part of the optical semiconductor package of the fifth modification. The optical semiconductor package of the fifth modification will be described below with reference to FIGS. 9 and 10.

As illustrated in FIG. 9, in an optical semiconductor package 1F of the fifth modification, the optical transparency sealing layer 30 includes an optical transparency composition 41 that is of a parent material and an optical transparency filler 42 that is dispersed in the optical transparency composition 41. A polymer material is used as a raw material of the optical transparency composition 41. According to one or more embodiments of the present invention, an epoxy resin, a silicone resin, polymethacrylate, polycarbonate, cycloolefin polymer, and the like can be used as the polymer material. According to one or more embodiments of the present invention, a glass filler is used as the optical transparency filler 42. The optical transparency filler 42 is added to the optical transparency sealing layer 30 in order to mainly prevent delamination between interfaces, warpage of the whole package, or the disconnection of the bonding wire 16 due to a difference in linear expansion coefficient among the optical transparency sealing layer 30, the interposer 10, and the LED chip 20, thereby improving reliability of the optical semiconductor package.

In the case where the optical transparency sealing layer 30 includes the optical transparency filler 42, the optical transparency filler 42 is not processed due to a difference of the material under the processing condition of the optical transparency composition 41 included in the optical transparency sealing layer 30 when the air gap 31 is formed using the femtosecond laser beam, and the air gap 31 is not formed in the portion in which the optical transparency filler 42 is located. Therefore, many holes exist in the interface R1, which is formed by providing the air gap 31 and acts as the reflector, and the light is transmitted through the optical transparency filler 42 without being reflected in the portion in which the optical transparency filler 42 is located.

In the optical semiconductor package 1F of the fifth modification, an externally added air gap 36 is provided in the optical transparency sealing layer 30 in addition to the air gap 31. According to one or more embodiments of the present invention, the externally added air gap 36 has the cylindrical shape surrounding the optical axis OA of the LED chip 20, surrounding the LED chip 20. Similarly to the air gap 31, for example, the externally added air gap 36 is formed by irradiating the optical transparency sealing layer 30 with the femtosecond laser beam, and the externally added air gap 36 is formed into the substantially conical plate shape as illustrated in FIG. 9.

The externally added air gap 36 is provided in the portion located outside the air gap 31 in the optical transparency sealing layer 30, and the externally added air gap 36 is disposed in coaxial with the air gap 31. At this point, an interface R6 corresponding to the inner circumferential surface of the externally added air gap 36 in the interface formed by the cylindrical externally added air gap 36 and the optical transparency sealing layer 30 acts as the reflecting surface (the reflector) that reflects part of the light emitted from the LED chip 20.

As illustrated in FIG. 10, using the above configuration, almost all of the light transmitted through the optical transparency filler 42 without being reflected by the interface R1 is reflected by the interface R6 located outside the interface R1. At least part of the light reflected by the interface R6 is returned to the inside of the air gap 31 again through the optical transparency filler 42, which is located so as to stride over the air gap 31.

According to the optical semiconductor package 1F of the fifth modification, the degradation of the light takeoff efficiency can be reduced in the case where the optical transparency sealing layer 30 includes the optical transparency filler 42. An existence probability of the optical transparency filler 42 striding over the air gap 31 and the externally added air gap 36 increases in the case where the air gap 31 and the externally added air gap 36 are disposed close to each other. Therefore, as illustrated in FIG. 10, according to one or more embodiments of the present invention, the air gap 31 and the externally added air gap 36 are disposed such that a distance A between the interface R1 and the interface R6 is greater than a diameter B of the optical transparency filler 42.

<Sixth Modification>

Figure 11:
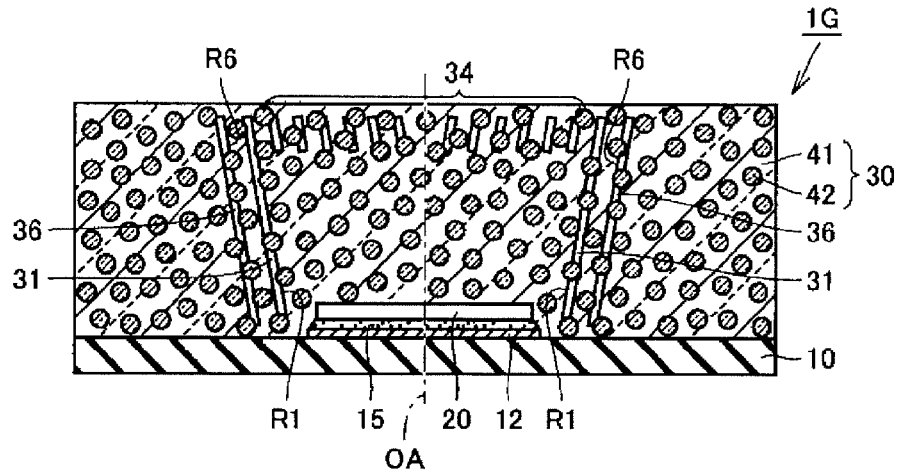
FIG. 11 is a schematic sectional view of an optical semiconductor package according to a sixth modification.

FIG. 11 is a schematic sectional view of an optical semiconductor package according to a sixth modification of the first embodiment. The optical semiconductor package of the sixth modification will be described below with reference to FIG. 11.

As illustrated in FIG. 11, an optical semiconductor package 1G of the sixth modification has both the characteristic configuration of the fifth modification and the characteristic configuration of the third modification. That is, in the optical semiconductor package 1G of the sixth modification, the optical transparency sealing layer 30 includes the optical transparency filler 42, and the ring-belt-shape added air gap 34 and the externally added air gap 36 are further provided in the optical transparency sealing layer 30 in addition to the air gap R1. The ring-belt-shape added air gap 34 is provided in the portion closer to the surface of the optical transparency sealing layer 30.

In the case where the optical transparency sealing layer 30 includes the optical transparency filler 42, based on a difference in refractive index between the optical transparency composition 41 and the optical transparency filler 42, the refraction, the diffraction, and the reflection are generated in the interface, and the scattering state of the light emitted from the LED chip 20 is intensified with increasing content of the optical transparency filler 42. For this reason, in order to irradiate the irradiation target region with the larger amount of light, according to one or more embodiments of the present invention, the optical semiconductor package is configured such that the larger amount of light reaches the surface of the optical transparency sealing layer 30, and an optical path is controlled near the surface of the optical transparency sealing layer 30.

Accordingly, because the use of the configuration of the optical semiconductor package 1G of the sixth modification satisfies these conditions, the degradation of the light takeoff efficiency can be reduced in the case where the optical transparency sealing layer 30 includes the optical transparency filler 42, and the low-profile, compact optical semiconductor package in which the high light collecting capacity is implemented can be constructed.

<Seventh Modification>

Figure 12:
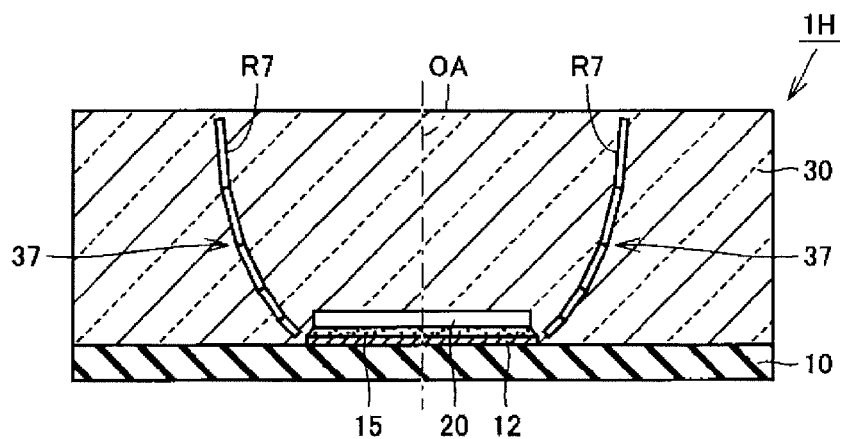
FIG. 12 is a schematic sectional view of an optical semiconductor package according to a seventh modification.

FIG. 12 is a schematic sectional view of an optical semiconductor package according to a seventh modification of the first embodiment. The optical semiconductor package of the seventh modification will be described below with reference to FIG. 12.

As illustrated in FIG. 12, in an optical semiconductor package 1H of the seventh modification, a plurality of cylindrical air gaps having different inclinations with respect to the optical axis OA of the LED chip 20 are disposed while arrayed along the extending direction of the optical axis OA, thereby constructing an air gap 37 having the cylindrical shape as a whole. For example, each of the plurality of air gaps is formed by irradiating the optical transparency sealing layer 30 with the femtosecond laser beam.

When the configuration of the optical semiconductor package 1H of the seventh modification is used, the shape of an interface R7 that acts as the reflector can be formed into a pseudo-curved surface and the like by properly adjusting a gradient, a size, and a position of each air gap, and a degree of freedom in design of light controllability is enhanced.

<Eighth Modification>

Figure 13:
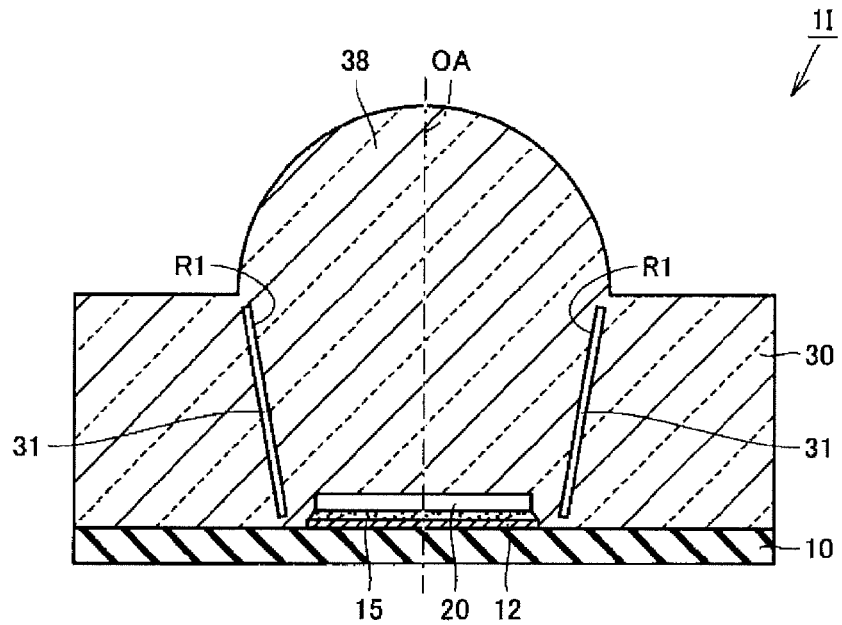
FIG. 13 is a schematic sectional view of an optical semiconductor package according to an eighth modification.

FIG. 13 is a schematic sectional view of an optical semiconductor package according to an eighth modification of the first embodiment. The optical semiconductor package of the eighth modification will be described below with reference to FIG. 13.

As illustrated in FIG. 13, in a configuration of an optical semiconductor package 1I of the eighth modification, a convex lens 38 is provided on the surface of the optical transparency sealing layer 30. Here, the convex lens 38 is integrally provided in forming the optical transparency sealing layer 30, and the convex lens 38 acts as a collective lens for the light emitted from the LED chip 20.

When the configuration of the optical semiconductor package 1I of the eighth modification is used, the optical semiconductor package in which the higher light collecting capacity is implemented can be constructed by a combination of the convex lens 38 and the interface R1 that acts as the reflector formed by providing the cylindrical air gap 31. The degree of freedom in design of the light controllability is further enhanced by properly adjusting the shape, the size, and the position of the convex lens 38 and the gradient, the size, and position of the air gap 31.

<Ninth Modification>

Figure 14:
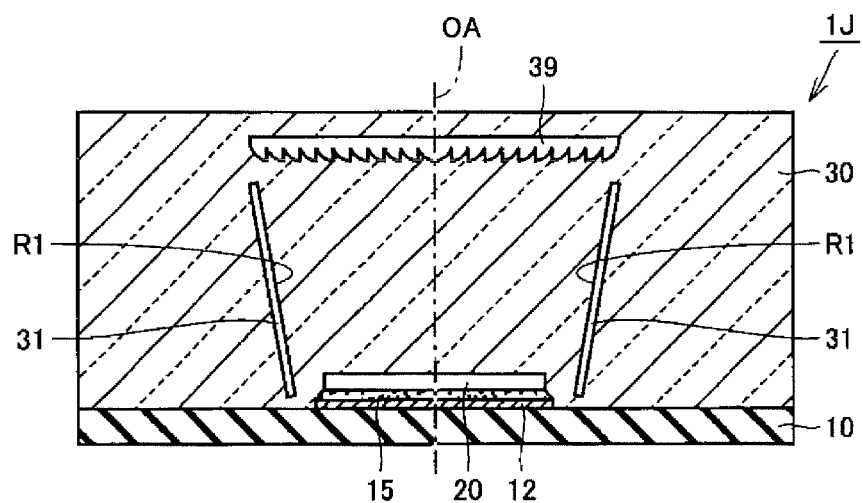
FIG. 14 is a schematic sectional view of an optical semiconductor package according to a ninth modification.

FIG. 14 is a schematic sectional view of an optical semiconductor package according to a ninth modification of the first embodiment. The optical semiconductor package of the ninth modification will be described below with reference to FIG. 14.

As illustrated in FIG. 14, in a configuration of an optical semiconductor package 1J of the ninth modification, a Fresnel lens 39 is provided near the surface of the optical transparency sealing layer 30. Here, the Fresnel lens 39 is integrally provided in forming the optical transparency sealing layer 30, and the Fresnel lens 39 acts as the collective lens for the light emitted from the LED chip 20. For example, similarly to the air gap 31, the Fresnel lens 39 is formed by irradiating the optical transparency sealing layer 30 with the femtosecond laser beam.

When the configuration of the optical semiconductor package 1J of the ninth modification is used, the optical semiconductor package in which the higher light collecting capacity is implemented can be constructed by a combination of the Fresnel lens 39 and the interface R1 that acts as the reflector formed by providing the cylindrical air gap 31. The degree of freedom in design of the light controllability is further enhanced by properly adjusting the shape, the size, and the position of the Fresnel lens 39 and the gradient, the size, and position of the air gap 31.

(Second Embodiment)

Figure 15:
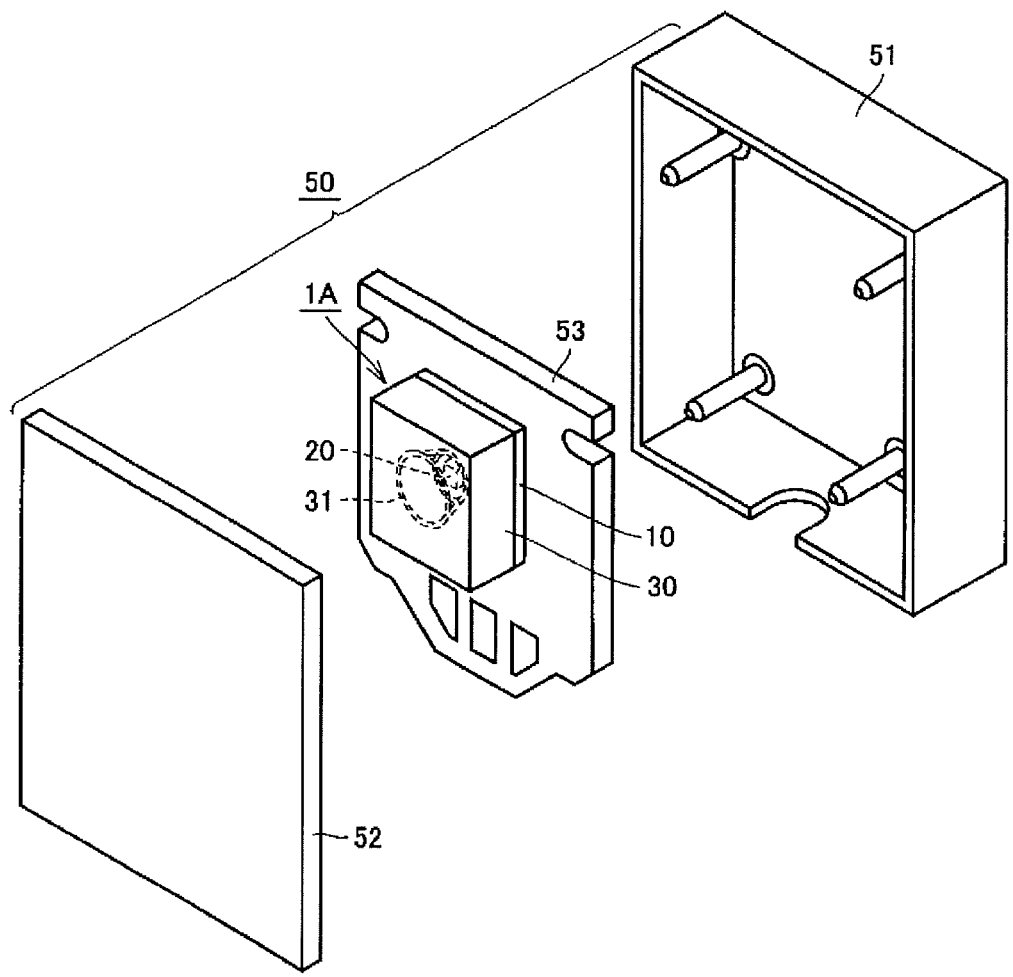
FIG. 15 is an exploded perspective view of an optical semiconductor module according to a second embodiment of the present invention.

FIG. 15 is an exploded perspective view of an optical semiconductor module according to a second embodiment of the present invention. The optical semiconductor module of the second embodiment will be described below with reference to FIG. 15.

As illustrated in FIG. 15, an optical semiconductor module 50 of the second embodiment includes the optical semiconductor package 1A, a case 51, a cap 52, and a mounting board 53. The optical semiconductor package 1A is the surface-mountable electronic component that is described in the first embodiment of the present invention, and the cylindrical air gap 31 is formed in the optical transparency sealing layer 30 of the optical semiconductor package 1A. For example, the optical semiconductor module 50 of the second embodiment is the projector of the photoelectric sensor.

As described above, the land 13 is provided in the rear surface of the interposer 10 of the optical semiconductor package 1A, and the optical semiconductor package 1A is mounted on the mounting board 53 by coupling the land 13 and a land provided on the surface of the mounting board 53 using solder. The mounting board 53, on which the optical semiconductor package 1A is mounted, is accommodated in and fixed to the case 51. The cap 52 is attached to the case 51, thereby closing an opening of the case 51. The cap 52 is constructed by an optical transparency member that can transmit the light projected from the optical semiconductor package 1A toward the outside. According to one or more embodiments of the present invention, polycarbonate, acryl, or polyacrylate is used for the optical transparency member constituting the cap 52 from the viewpoint of mechanical strength.

The optical semiconductor module 50 is constructed as described above, the compact, low-profile optical semiconductor module 50 can thereby easily be manufactured, and the light use efficiency can sufficiently be improved in the optical semiconductor module.

(Third Embodiment)

Figure 16:
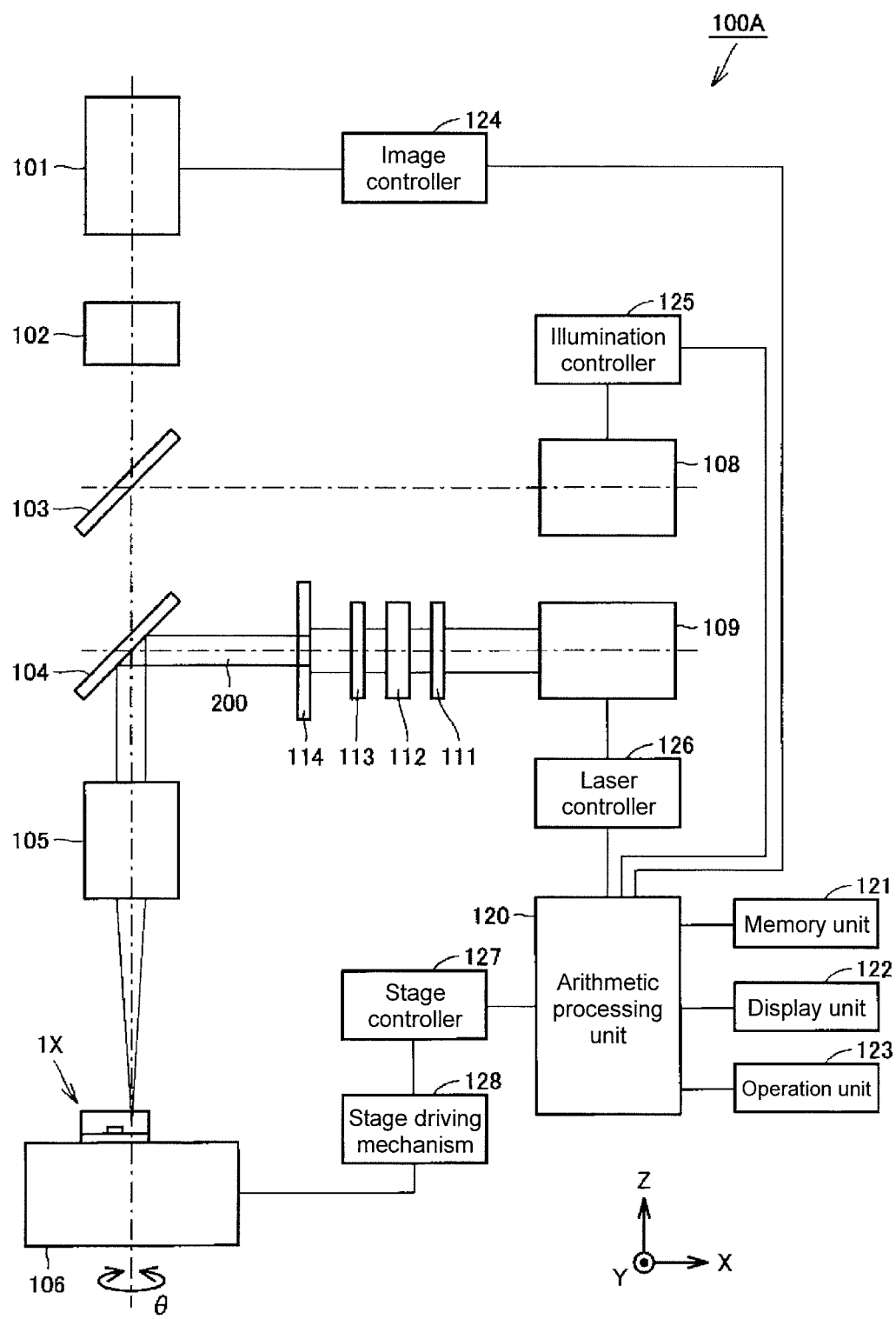
FIG. 16 is a view illustrating a configuration of a manufacturing apparatus that performs an optical semiconductor package manufacturing method according to a third embodiment of the present invention.

FIG. 16 is a view illustrating a configuration of a manufacturing apparatus that performs an optical semiconductor package manufacturing method according to a third embodiment of the present invention. The optical semiconductor package manufacturing method of the third embodiment will be described below with reference to FIG. 16.

As illustrated in FIG. 16, a manufacturing apparatus 100A that perform the optical semiconductor package manufacturing method of the third embodiment is a laser processing apparatus that forms the air gap in the optical transparency sealing layer of the optical semiconductor package using the ultrashort pulsed laser beam (the femtosecond laser beam) having pulse widths of $10^{-15}$ second (1 femtosecond) to $10^{-11}$ second (10 picoseconds).

A manufacturing apparatus 100A includes a camera 101, an illumination source 108, a laser source 109, various optical systems 102 to 105 and 111 to 114, a stage 106 on which a workpiece 1X is placed, an arithmetic processing unit 120, a memory unit 121, a display unit 122, an operation unit 123, an image controller 124, an illumination controller 125, a laser controller 126, a stage controller 127, and a stage driving mechanism 128.

The camera 101 is a device for capturing an image of the workpiece 1X placed on the stage 106, and the image controller 124 controls action of the camera 101. The image controller 124 controls the action of the camera 101, and outputs data of the captured image to the arithmetic processing unit 120. The imaging lens 102 and the objective lens 105 are attached to the camera 101. The optical systems attached to the camera 101 may be set to an infinite position (a confocal position) or a finite position. According to one or more embodiments of the present invention, the imaging lens 102 is disposed on the side of the camera 101 rather than the half mirror 103 and the dielectric mirror 104.

The illumination source 108 is a device for irradiating the workpiece 1X placed on the stage 106 with the illumination light, and the illumination controller 125 controls the action of the illumination source 108. The illumination controller 125 controls the action of the illumination source 108. The half mirror 103 is attached to the illumination source 108, thereby performing coaxial epi-illumination of a ray used in the imaging and a ray used in the illumination.

The laser source 109 is a device for irradiating the workpiece 1X placed on the stage 106 with a laser beam 200. For example, the laser source 109 includes a titanium-sapphire crystal as a laser medium. The laser beam 200 emitted from the laser source 109 is the femtosecond laser beam. The laser controller 126 controls the action of the laser source 109. The laser controller 126 receives an input of a calculation result of the arithmetic processing unit 120, and controls the action of the laser source 109 based on the calculation result.

The ND filter 111, the attenuator 112, the electromagnetic shutter 113, and the aperture 114 are attached to the laser source 109. The ND filter 111, the attenuator 112, the electromagnetic shutter 113, and the aperture 114 are used to adjust energy (pulse energy), processing pattern, a beam diameter of the laser beam 200. The dielectric mirror 104 is attached to the laser source 109, thereby performing the coaxial epi-illumination of the laser beam used in the laser processing and the ray used in the imaging. The objective lens 105 also acts as the objective lens for the laser beam 200 emitted from the laser source 109.

As described above, the stage 106 is a retention part for retaining the workpiece 1X placed thereon, and the stage driving mechanism 128 drives the stage 106 in translational three axial directions including an X-axis direction, a Y-axis direction, and a Z-axis direction and a θ-direction that is of a rotating direction about the Z-axis. The stage controller 127 controls the action of the stage driving mechanism 128. The stage controller 127 receives the input of the calculation result of the arithmetic processing unit 120, and controls the action of the stage driving mechanism 128 based on the calculation result.

The arithmetic processing unit 120 performs various calculations, and controls the whole of the manufacturing apparatus 100A. The memory unit 121 is a part for storing various programs driving and controlling the camera 101, the illumination source 108, the laser source 109, and the stage 106 and various pieces of information necessary to drive and control these components. The display unit 122 is a part for displaying an operating state of the manufacturing apparatus 100A or a progress situation of the processing. The operation unit 123 is a part for inputting a command to the manufacturing apparatus 100A.

In the optical semiconductor package manufacturing method of the third embodiment, an LED chip assembly position in the workpiece 1X is observed using the camera 101, the position where the air gap should be formed is determined based on the observation result, and the laser processing is performed by controlling the drive of the laser source 109 and the stage 106 such that the air gap is formed in the position. Specifically, for example, the following procedures are adopted.

The workpiece 1X in which the air gap is not formed yet is disposed in the observation region on the stage 106, and the workpiece 1X is irradiated with the illumination light by driving the illumination source 108. At this point, image recognition is performed using the camera 101. The stage 106 is driven along the Z-axis direction, whereby the stage 106 is adjusted such that the image of the surface of the LED chip is brought into focus. After the focusing, the image is captured and used as an image recognition target.

Subsequently, the image controller 124 obtains the center position of the LED chip based on the data of the captured image, and the information on the center position is inputted to the arithmetic processing unit 120. The arithmetic processing unit 120 calculates a difference between positional information on a processing axis of the laser beam 200, which is stored in the memory unit 121, and information on the center position of the LED chip. The calculated difference information is inputted to the stage controller 127. Based on the difference information, the stage controller 127 drives the stage driving mechanism 128 to align the processing axis of the laser beam 200 with the center position of the LED chip.

Then, the arithmetic processing unit 120 reads a processing program previously stored in the memory unit 121, and the laser processing is performed while the drive of the laser source 109 and the stage 106 is controlled based on the processing program. For example, the stage 106 is moved along the X-axis direction and the Z-axis direction such that the laser beam 200 focuses on an initial position where the air gap is formed. Then, the laser irradiation is performed to form the first-layer air gap while the stage 106 goes into a 360-degree turn in the θ-direction. Then, the stage 106 is moved along the X-axis direction and the Z-axis direction to change the initial position where the air gap is to be formed, and the laser irradiation is performed to form the second-layer air gap while the stage 106 goes into the 360-degree turn in the θ-direction again. The air gap having the desired shape is formed by repeatedly performing the action.

The adoption of the optical semiconductor package manufacturing method of the third embodiment can ensure the accuracy of the position of the interface acting as the reflector with respect to the LED chip based on image recognition accuracy, stage driving accuracy, and laser processing accuracy. For this reason, an assembly error generated during the assembly of the components is not included, so that the interface acting as the reflector can more accurately be formed than ever before. Accordingly, the air gap can accurately easily be formed in the desired position of the optical transparency sealing layer of the optical semiconductor package, and the high-performance optical semiconductor package having a small performance variation can be manufactured at low cost.

(Fourth Embodiment)

Figure 17:
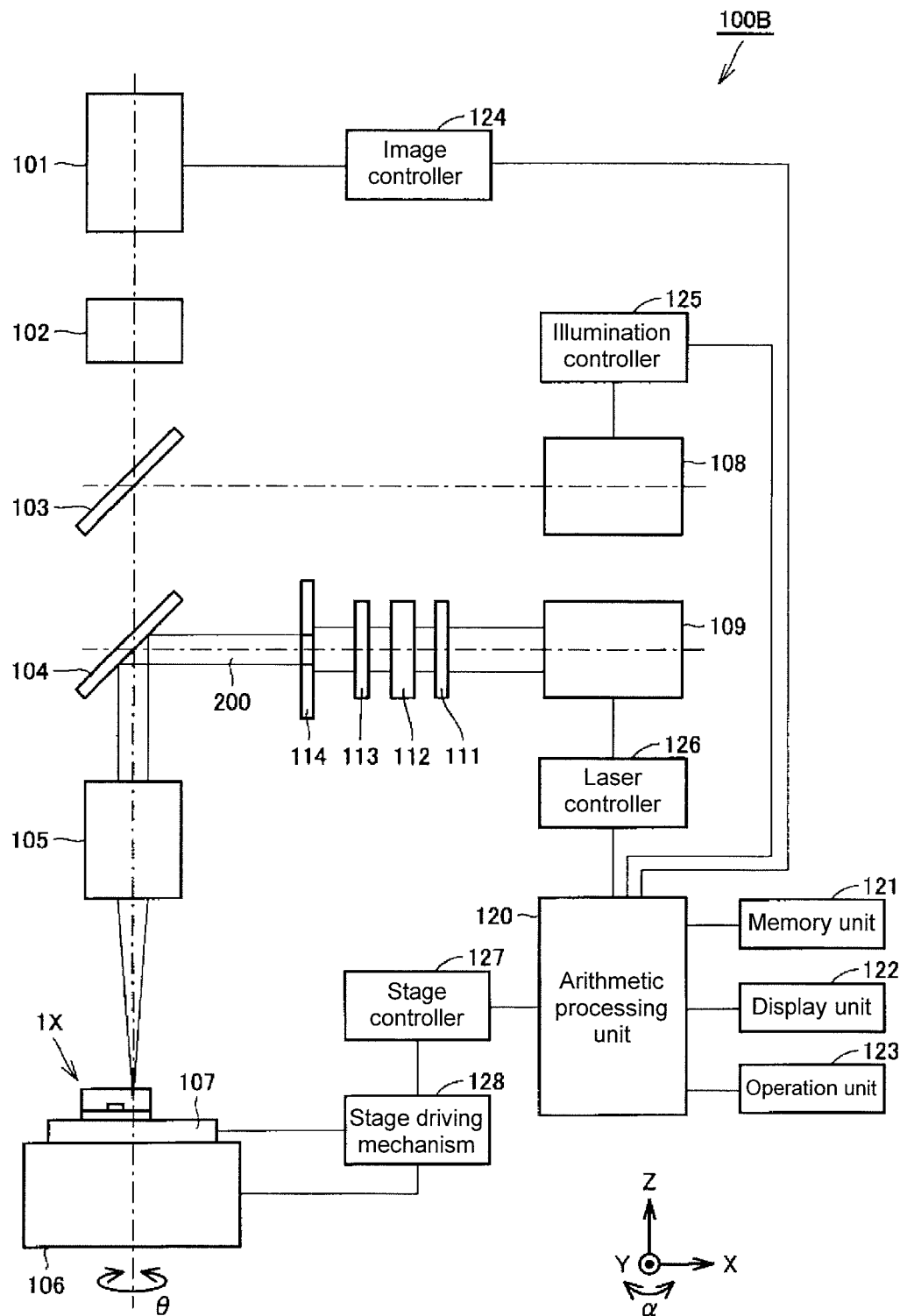
FIG. 17 is a view illustrating a configuration of a manufacturing apparatus that performs an optical semiconductor package manufacturing method according to a fourth embodiment of the present invention.

FIG. 17 is a view illustrating a configuration of a manufacturing apparatus that performs an optical semiconductor package manufacturing method according to a fourth embodiment of the present invention. The optical semiconductor package manufacturing method of the fourth embodiment will be described below with reference to FIG. 17.

As illustrated in FIG. 17, a manufacturing apparatus 100B that performs the optical semiconductor package manufacturing method of the fourth embodiment further includes a goniostage 107 on the stage 106 compared with the manufacturing apparatus 100A in FIG. 16. The goniostage 107 is a part for driving the placed workpiece 1X in an a-direction that is of the rotating direction about the Y-axis, and the workpiece 1X can be driven in the translational three axis directions and rotational two axis directions by a combination of the goniostage 107 and the stage 106. The stage driving mechanism 128 controls the drive of the goniostage 107.

In the optical semiconductor package manufacturing method of the fourth embodiment, the LED chip assembly position in the workpiece 1X is observed using the camera 101, the position where the air gap should be formed is determined based on the observation result, and the laser processing is performed by controlling the drive of the laser source 109 and the stage 106 such that the air gap is formed in the position. At this point, in the optical semiconductor package manufacturing method of the fourth embodiment, when the surface of the LED chip is tilt-disposed, the laser processing is performed while the tilt of the surface of the LED chip is corrected.

Specifically, in the procedure of the optical semiconductor package manufacturing method of the third embodiment, the stage 106 and the goniostage 107 are driven during the image recognition such that three corners in four corners of the surface of the LED chip are brought into focus, a distance between the residual corner and the three corners is measured while the three corners are brought into focus, and the gradient of the surface of the LED chip is obtained based on the distance. Then, the goniostage 107 is driven to correct the gradient, and the laser processing is performed according to the procedure of the optical semiconductor package manufacturing method of the third embodiment.

When the optical semiconductor package manufacturing method of the fourth embodiment is adopted, advantageously the interface that acts as the reflector with high accuracy can be formed in addition to the effect of the third embodiment.

(Fifth Embodiment)

Figure 18:
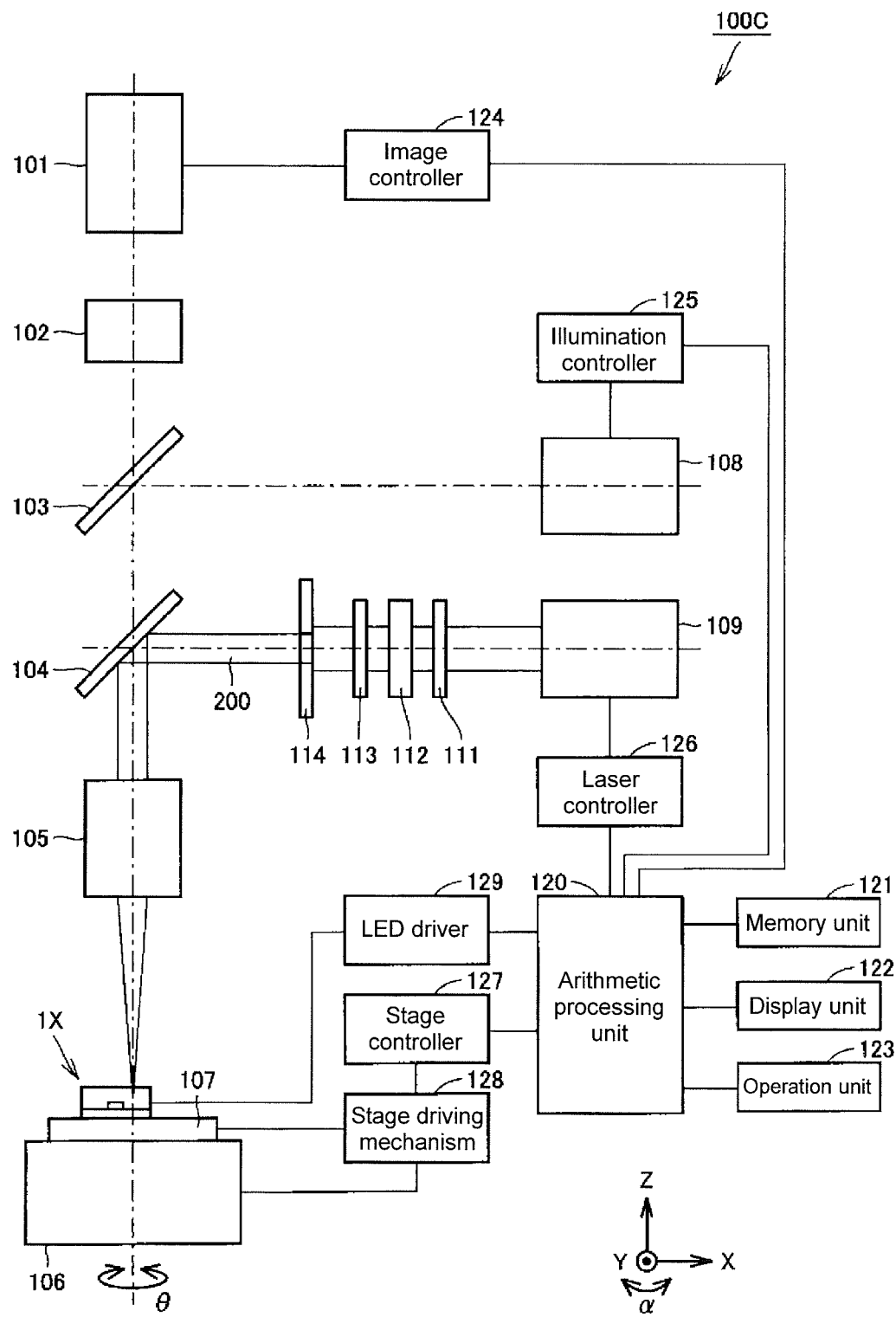
FIG. 18 is a view illustrating a configuration of a manufacturing apparatus that performs an optical semiconductor package manufacturing method according to a fifth embodiment of the present invention.
Figure 19:
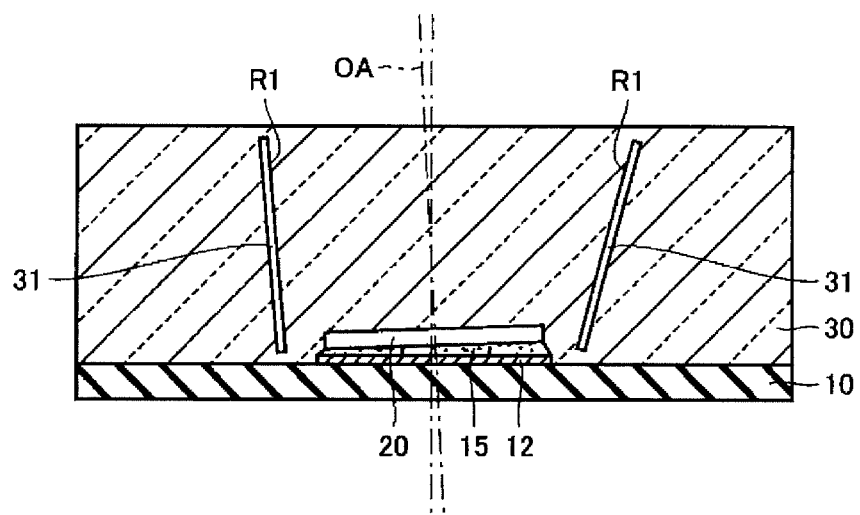
FIG. 19 is a sectional view of the optical semiconductor package that is laser-processed such that an air gap is tilt-disposed by adopting the optical semiconductor package manufacturing method according to the fifth embodiment of the present invention.

FIG. 18 is a view illustrating a configuration of a manufacturing apparatus that performs an optical semiconductor package manufacturing method according to a fifth embodiment of the present invention, and FIG. 19 is a sectional view of the optical semiconductor package that is laser-processed such that the air gap is tilt-disposed. The optical semiconductor package manufacturing method of the fifth embodiment will be described below with reference to FIGS. 18 and 19.

As illustrated in FIG. 18, a manufacturing apparatus 100C that performs the optical semiconductor package manufacturing method of the fifth embodiment further includes an LED driver 129 that drives the LED chip included in the workpiece 1X in order to emit the light compared with the manufacturing apparatus 100B in FIG. 17.

In the optical semiconductor package manufacturing method of the fifth embodiment, the LED chip assembly position in the workpiece 1X is observed using the camera 101, the position where the air gap should be formed is determined based on the observation result, and the laser processing is performed by controlling the drive of the laser source 109 and the stage 106 such that the air gap is formed in the position. At this point, in the optical semiconductor package manufacturing method of the fifth embodiment, the gradient of the optical axis of the LED chip is detected. When the gradient is out of an allowable range, and the laser processing is performed to correct the tilt such that the air gap is tilt-disposed That is, in the case where the surface of the LED chip is tilt-disposed, the optical axis of the LED chip is also tilt-disposed due to the tilt-disposed surface. Frequently the alignment between the optical semiconductor package and component such as a casing of the optical semiconductor module in which the optical semiconductor package is assembled is typically designed based on the rear surface of the interposer of the optical semiconductor package. Accordingly, a misalignment of the optical axis is expressed as an misalignment of the optical axis in the optical semiconductor module unless the misalignment of the optical axis is corrected.

In the optical semiconductor package manufacturing method of the fifth embodiment, as illustrated in FIG. 19, a projection axis of the light projected from the optical semiconductor package is aligned with the direction normal to the rear surface of the interposer 10, and the cylindrical air gap 31 can be formed such that the inclination of the interface R1 acting as the reflector is adjusted.

Specifically, in the procedure of the optical semiconductor package manufacturing method of the third embodiment, the LED 20 emits the light using the LED driver 129 during the image recognition, an irradiation intensity distribution is calculated based on the image data, and the gradient of the optical axis OA of the LED chip 20 is obtained based on the irradiation intensity distribution. Then the laser processing is performed while the stage 106 and the goniostage 107 are properly adjusted such that the cylindrical air gap 31 is tilted by the gradient of the optical axis OA of the LED chip 20 with respect to the projection axis of the optical semiconductor package. At this point, the processing program may be previously installed such that the gradient of the optical axis OA of the LED chip 20 with respect to the projection axis of the optical semiconductor package is properly corrected.

When the optical semiconductor package manufacturing method of the fifth embodiment is adopted, advantageously the interface that acts with high accuracy as the reflector can be formed in addition to the effect of the third embodiment.

(Sixth Embodiment)

Figure 20:
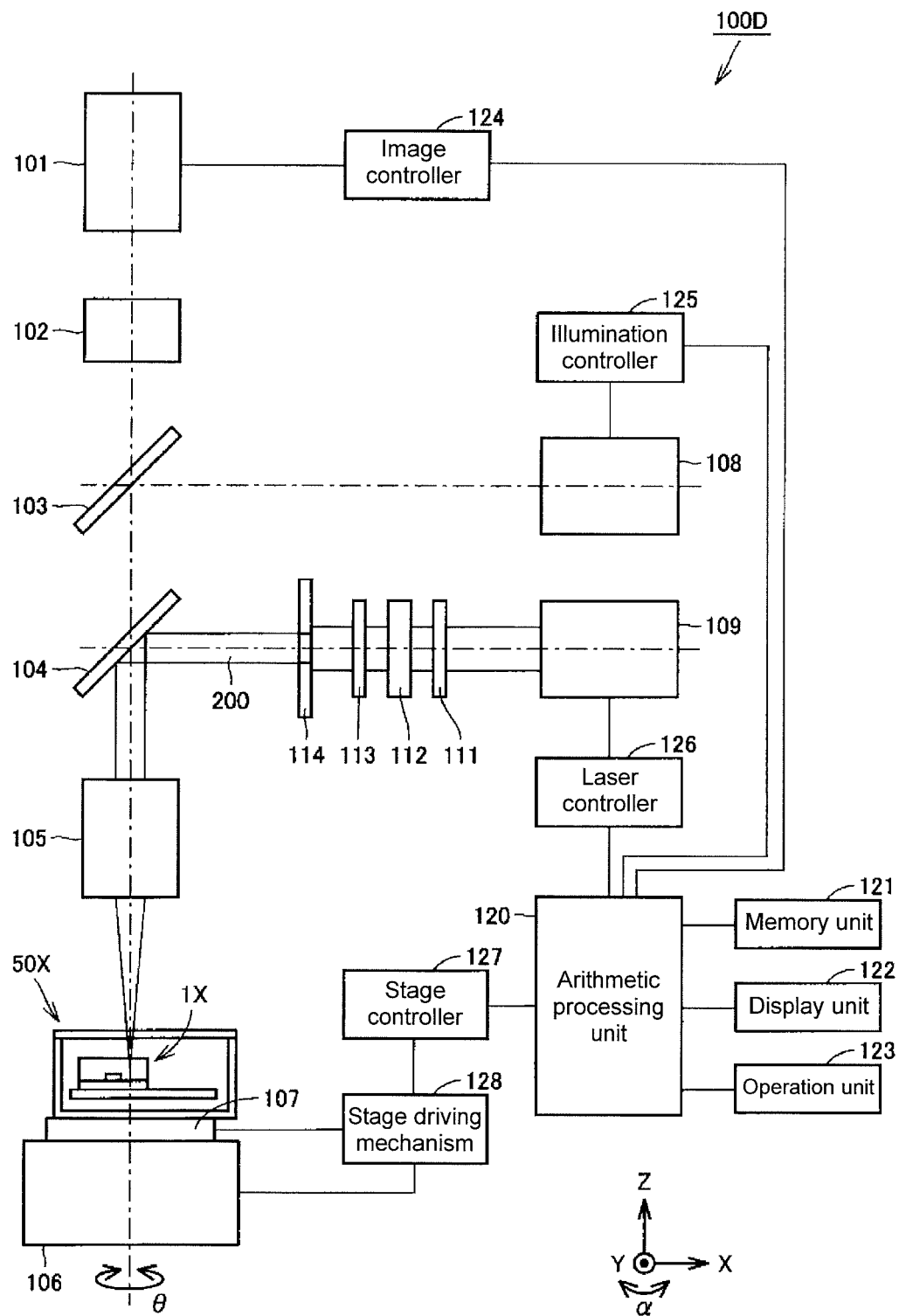
FIG. 20 is a view illustrating a configuration of a manufacturing apparatus that performs an optical semiconductor package manufacturing method according to a sixth embodiment of the present invention.

FIG. 20 is a view illustrating a configuration of a manufacturing apparatus that performs an optical semiconductor module manufacturing method according to a sixth embodiment of the present invention. The optical semiconductor module manufacturing method of the sixth embodiment will be described below with reference to FIG. 20.

As illustrated in FIG. 20, a manufacturing apparatus 100D that performs the optical semiconductor package manufacturing method of the sixth embodiment is similar to the manufacturing apparatus 100B in FIG. 17. The manufacturing apparatus 100D differs from the manufacturing apparatus 100B only in that a workpiece 50X (the optical semiconductor module in which the air gap is not formed yet) is placed on the goniostage 107. For example, the optical semiconductor module of the sixth embodiment is the projector of the photoelectric sensor.

In the optical semiconductor module manufacturing method of the sixth embodiment, the LED chip assembly position in the workpiece 50X is observed using the camera 101, the position where the air gap should be formed is determined based on the observation result, and the laser processing is performed by controlling the drive of the laser source 109 and the stage 106 such that the air gap is formed in the position. At this point, in the optical semiconductor module manufacturing method of the sixth embodiment, when the surface of the LED chip is tilt-disposed, the laser processing is performed while the tilt of the surface of the LED chip is corrected. The specific procedure is pursuant to the optical semiconductor package manufacturing method of the fourth embodiment of the present embodiment.

The adoption of the optical semiconductor module manufacturing method of the sixth embodiment can ensure the accuracy of the position of the interface acting as the reflector with respect to the LED chip based on the image recognition accuracy, the stage driving accuracy, and the laser processing accuracy. For this reason, the assembly error generated during the assembly of the component is not included, so that the interface acting as the reflector can be formed with higher accuracy than ever before. Accordingly, the air gap can easily be formed, with high accuracy, in the desired position of the optical transparency sealing layer of the optical semiconductor package, and the high-performance optical semiconductor module having the small performance variation can be manufactured at low cost.

In the optical semiconductor module manufacturing method of the sixth embodiment, by way of example, the laser processing is performed while the tilt-disposed surface of the LED chip is corrected (that is, the surface of the LED chip is corrected so as to be horizontally disposed). The gradient of the optical axis of the LED chip is detected and, when the gradient is out of the allowable range, the laser processing may be performed to correct the gradient such that the air gap is tilt-disposed.

Usually, in attaching the optical semiconductor module to an external facility, a surface on which the optical semiconductor module is attached to the external facility (usually a casing back face located on the opposite side to the projection surface to which the light is projected, namely, the surface of the workpiece 50X located on the side of the goniostage 107 in the case of FIG. 20) is used as a reference surface. Therefore, a perpendicular degree between the reference surface and the optical axis of the LED chip becomes significantly important.

Accordingly, in order to ensure the perpendicular degree between the reference surface and the optical axis of the LED chip, the optical semiconductor module may be manufactured by adopting the manufacturing method pursuant to the optical semiconductor package manufacturing method of the fifth embodiment. Referring to FIG. 20, the LED chip included in the workpiece 50X placed on the goniostage 107 emits the light using the LED driver to obtain the gradient of the optical axis, and the laser processing may be performed while the stage 106 and the goniostage 107 are properly adjusted such that the cylindrical air gap is tilted by the gradient of the LED chip with respect to the optical axis.

When the optical semiconductor module manufacturing method is adopted, the high-performance optical semiconductor module having the small performance variation can be manufactured at low cost.

In the first to sixth embodiments and the modifications thereof, by way of example, one or more embodiments of the present invention is applied to the LED package, the LED module, and the manufacturing method thereof. Alternatively, one or more embodiments of the present invention can be applied to any optical semiconductor package, any optical semiconductor module, and the manufacturing method thereof as long as an optical semiconductor light emitting element having low directivity (that is, the wide total angle of the emission property) is used as the light source.

In the first to sixth embodiments and the modifications thereof, by way of example, one or more embodiments of the present invention is applied to the optical semiconductor package including the optical semiconductor light emitting element, the optical semiconductor module, and the manufacturing method thereof. Alternatively, one or more embodiments of the present invention may be applied to the optical semiconductor package including an optical semiconductor light receiving element typified by a PD, the optical semiconductor module, and the manufacturing method thereof. That is, one or more embodiments of the present invention can also be applied to the optical receiver of the photoelectric sensor and the like.

In the third to sixth embodiments, by way of example, the workpiece is individually placed on the stage, and the imaging, the arithmetic processing, and the laser processing are sequentially performed. Alternatively, the plurality of workpieces are placed on the stage, and the workpieces may individually be processed in the procedure. Alternatively, the plurality of workpieces are placed on the stage, the images of all the workpieces are captured, the arithmetic processing is performed to all the workpieces, and the laser processing may be sequentially performed to all the workpieces. In the case where the laser processing is performed at the stage of the optical semiconductor package, and in the case where the plurality of workpieces are placed on the stage, plurality of post-dicing optical semiconductor packages may be processed while placed on the stage, or a pre-dicing optical semiconductor package group is processed while placed on the stage, and then the dicing may be performed.

In the third to sixth embodiments, by way of example, the single manufacturing apparatus is configured such that the imaging, the arithmetic processing, and the laser processing are performed. Alternatively, the manufacturing apparatus is configured while the imaging, the arithmetic processing, and the laser processing may be separated from one another to shorten a lead time.

In the first to sixth embodiments and the modifications thereof, the characteristic configurations can be combined without departing from the scope of the present invention.

The disclosed embodiments and modifications thereof are illustrative only, but not restrictive. The technical scope of the present invention is defined by claims, and the meaning equivalent to the range of the claims and all the changes within the range are included in the present invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

DESCRIPTION OF SYMBOLS 1A to 1J optical semiconductor package
1X workpiece
10 interposer (base material)
10a principal surface
11 to 13 land
14 through-hole
15 solder layer
16 bonding wire
20 LED chip
30 optical transparency sealing layer
31, 32, 37 air gap
33 internally added air gap
34 ring-belt-shape added air gap
35 array-shape added air gap
36 externally added air gap
38 convex lens
39 Fresnel lens
41 optical transparency composition
42 optical transparency filler
50 optical semiconductor module
50X workpiece
51 case
52 cap
53 mounting board
100A to 100D manufacturing apparatus
101 camera
102 imaging lens
103 half mirror
104 dielectric mirror
105 objective lens
106 stage
107 goniostage
108 illumination source
109 laser source
111 ND filter
112 attenuator
113 electromagnetic shutter
114 aperture
120 arithmetic processing unit
121 memory unit
122 display unit
123 operation unit
124 image controller
125 illumination controller
126 laser controller
127 stage controller
128 stage driving mechanism
129 LED driver
200 laser beam

The invention claimed is:

1. An optical semiconductor package comprising:
a base material that includes a principal surface;
an optical semiconductor element that is located on the principal surface of the base material to project or receive light; and
an optical transparency sealing layer that seals the optical semiconductor element while covering the principal surface of the base material,
wherein an air gap having a shape surrounding an optical axis of the optical semiconductor element is provided in the optical transparency sealing layer such that the light is reflected by an interface of a portion corresponding to an inner circumferential surface of the air gap in an interface formed by the air gap and the optical transparency sealing layer,
wherein the optical semiconductor package further comprises:
a cylindrical internally added air gap disposed in a portion of the optical transparency sealing layer opposite to a side on which the base material is located, coaxially with the air gap and on an inner side of the air gap.

2. The optical semiconductor package according to claim 1, wherein the air gap is formed by irradiating the optical transparency sealing layer with an ultrashort pulsed laser beam having pulse widths of $10^{-15}$ second to $10^{-11}$ second.

3. The optical semiconductor package according to claim 1, wherein the air gap surrounds the optical semiconductor element.

4. The optical semiconductor package according to claim 1, wherein the air gap has a substantially conical plate shape in which a diameter of the air gap increases with distance from the optical semiconductor element along a thickness direction of the optical transparency sealing layer.

5. The optical semiconductor package according to claim 1, wherein the interface of the portion corresponding to the inner circumferential surface of the air gap includes at least two surfaces having inclinations different from each other with respect to the optical axis of the optical semiconductor element.

6. An optical semiconductor module comprising:
   the optical semiconductor package according to claim 1;
   a mounting board on which the optical semiconductor package is mounted; and
   a casing to which the mounting board is fixed.

7. The optical semiconductor module according to claim 6, wherein the optical semiconductor module is an optical sensor.

8. An optical semiconductor package comprising:
   a base material that includes a principal surface;
   an optical semiconductor element that is located on the principal surface of the base material to project or receive light; and
   an optical transparency sealing layer that seals the optical semiconductor element while covering the principal surface of the base material,
   wherein an air gap having a shape surrounding an optical axis of the optical semiconductor element is provided in the optical transparency sealing layer such that the light is reflected by an interface of a portion corresponding to an inner circumferential surface of the air gap in an interface formed by the air gap and the optical transparency sealing layer,
   wherein the optical semiconductor package further comprises:
      a plurality of cylindrical ring-belt-shape added air gaps, which are disposed in a portion of the optical transparency sealing layer opposite to a side on which the base material is located, in a ring-belt-shape manner coaxially with the air gap and on an inner side of the air gap.

9. An optical semiconductor package comprising:
   a base material that includes a principal surface;
   an optical semiconductor element that is located on the principal surface of the base material to project or receive light; and
   an optical transparency sealing layer that seals the optical semiconductor element while covering the principal surface of the base material,
   wherein an air gap having a shape surrounding an optical axis of the optical semiconductor element is provided in the optical transparency sealing layer such that the light is reflected by an interface of a portion corresponding to an inner circumferential surface of the air gap in an interface formed by the air gap and the optical transparency sealing layer,
   wherein the optical semiconductor package further comprises:
      a plurality of cylindrical array-shape added air gaps disposed in a portion of the optical transparency sealing layer opposite to a side on which the base material is located, on an inner side of the air gap.

10. An optical semiconductor package comprising:
    a base material that includes a principal surface;
    an opticaloptical semiconductor element that is located on the principal surface of the base material to project or receive light; and
    an optical transparency sealing layer that seals the optical semiconductor element while covering the principal surface of the base material,
    wherein an air gap having a shape surrounding an optical axis of the optical semiconductor element is provided in the optical transparency sealing layer such that the light is reflected by an interface of a portion corresponding to an inner circumferential surface of the air gap in an interface formed by the air gap and the optical transparency sealing layer,
    wherein the optical transparency sealing layer includes an optical transparency composition that is of a parent material and an optical transparency filler that is dispersed in the optical transparency composition, and
    wherein a cylindrical externally added air gap disposed in coaxial with the air gap is further provided in the optical transparency sealing layer of a portion located outside the air gap.

11. The optical semiconductor package according to claim 10, wherein a distance between the interface of the portion corresponding to the inner circumferential surface of the air gap and an interface of a portion corresponding to an inner circumferential surface of the externally added air gap in an interface formed by the externally added air gap and the optical transparency sealing layer is greater than a diameter of the optical transparency filler.

* * * * *

UNITED STATES PATENT AND TRADEMARK OFFICE
CERTIFICATE OF CORRECTION

| | |
|---|---|
| PATENT NO. | : 9,006,750 B2 |
| APPLICATION NO. | : 14/004360 |
| DATED | : April 14, 2015 |
| INVENTOR(S) | : Satoshi Hirono et al. |

It is certified that error appears in the above-identified patent and that said Letters Patent is hereby corrected as shown below:

In the Claims:

At column 1, claim 8, line 15, the word "laver" should read --layer--.

At column 1, claim 10, line 3, the words "optical optical semiconductor" should read --optical semiconductor--.

Signed and Sealed this
Twenty-ninth Day of September, 2015

Michelle K. Lee
*Director of the United States Patent and Trademark Office*